US010541596B2

(12) United States Patent
Ding

(10) Patent No.: US 10,541,596 B2
(45) Date of Patent: Jan. 21, 2020

(54) DISPLACEMENT DEVICE

(71) Applicant: GUANGDONG JIXUN PRECISION EQUIPMENT CO., LTD., Guangdong Province (CN)

(72) Inventor: Chenyang Ding, Eindhoven (NL)

(73) Assignee: GUANGDONG JIXUN PRECISION EQUIPMENT CO., LTD., Guangdong Province (CN)

( * ) Notice: Subject to any disclaimer, the term of this patent is extended or adjusted under 35 U.S.C. 154(b) by 128 days.

(21) Appl. No.: 15/741,721

(22) PCT Filed: Jun. 13, 2016

(86) PCT No.: PCT/EP2016/063454
§ 371 (c)(1),
(2) Date: Jan. 3, 2018

(87) PCT Pub. No.: WO2017/005457
PCT Pub. Date: Jan. 12, 2017

(65) Prior Publication Data
US 2018/0212505 A1    Jul. 26, 2018

(30) Foreign Application Priority Data
Jul. 6, 2015    (NL) ...................................... 2015092

(51) Int. Cl.
*H02K 41/03*    (2006.01)
*H02K 41/035*   (2006.01)
(Continued)

(52) U.S. Cl.
CPC ..... *H02K 41/0356* (2013.01); *G03F 7/70758* (2013.01); *G03F 7/70816* (2013.01);
(Continued)

(58) Field of Classification Search
CPC ...... H02K 41/00; H02K 41/02; H02K 41/025; H02K 41/03; H02K 41/031; H02K 41/035;
(Continued)

(56) References Cited

U.S. PATENT DOCUMENTS 6,496,093 B2    12/2002  Compter et al.
2003/0102721 A1*  6/2003  Ueta .................. G03F 7/70758
310/12.06
(Continued)

FOREIGN PATENT DOCUMENTS

EP         1357429 A1      10/2003
JP         2010-278298 A   12/2010
WO     WO2009/083889 A1    7/2009

OTHER PUBLICATIONS

International Search Report and Written Opinion for PCT Patent App. No. PCT/EP2016/063454 (Oct. 5, 2016).

*Primary Examiner* — Tran N Nguyen
(74) *Attorney, Agent, or Firm* — Kenealy Vaidya LLP

(57) ABSTRACT

A displacement device including a stage and a stator, wherein the stator is shaped to provide a working region and the stator includes: a plurality of magnet blocks of the first kind, each magnet block of the first kind including a plurality of first magnets generally linearly elongated in the X-direction, and a plurality of magnet blocks of the second kind, each magnet block of the second kind including a plurality of second magnets generally linearly elongated in the Y-direction. The stage is movably arranged next to the stator in the Z-direction, and the stage includes: a coil block of the first kind, each coil block of the first kind including a plurality of electric conductors generally linearly elongated in the X-direction; and a coil block of the second kind,
(Continued)

each coil block of the second kind including a plurality of electric conductors generally linearly elongated in the Y-direction.

16 Claims, 10 Drawing Sheets

(51) Int. Cl.
    *G03F 7/20*     (2006.01)
    *H02K 1/27*     (2006.01)
    *H02K 7/09*     (2006.01)

(52) U.S. Cl.
    CPC ............... *H02K 1/278* (2013.01); *H02K 7/09* (2013.01); *H02K 41/031* (2013.01); *H02K 2201/18* (2013.01); *H02K 2213/03* (2013.01)

(58) Field of Classification Search
    CPC .. H02K 1/17; H02K 1/26; H02K 1/27; H02K 1/278; H02K 1/279; H02K 1/2793; H02K 3/28; G03F 7/00; G03F 7/20; G03F 7/70; G03F 7/707; G03F 7/70716; G03F 7/70758; H01L 21/00; H01L 21/67; H01L 21/68; H01L 21/682
    See application file for complete search history.

(56) References Cited

U.S. PATENT DOCUMENTS

2005/0077786 A1*   4/2005   De Weerdt ............. H02K 41/03
                                                       310/12.07
2010/0090545 A1    4/2010   Binnard et al.
2014/0285122 A1    9/2014   Lu et al.

* cited by examiner

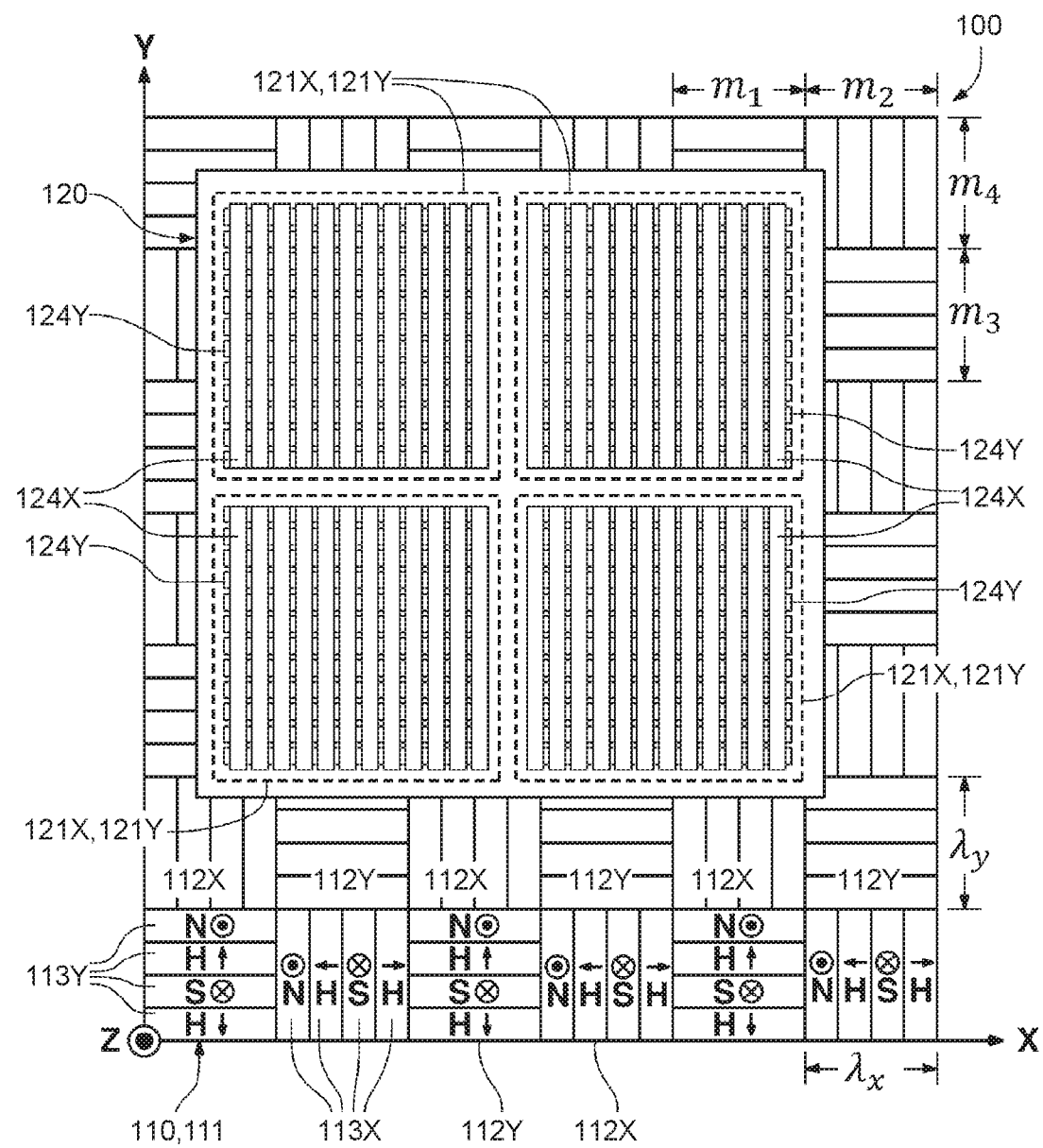
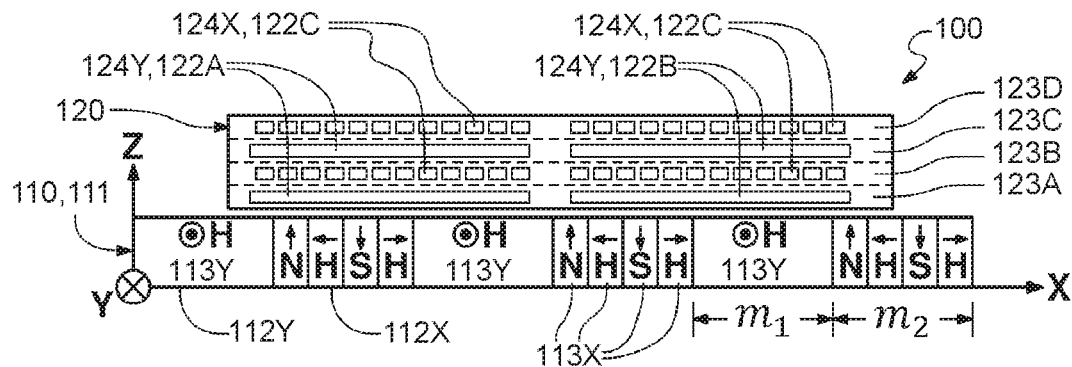
FIG. 1A
FIG. 1B

DISPLACEMENT DEVICE

CROSS REFERENCE TO RELATED APPLICATION(S)

This application is a National Phase Filing under 35 C.F.R. § 371 of and claims priority to PCT Patent Application No. PCT/EP2016/063454, filed on Jun. 13, 2016, which claims the priority benefit under 35 U.S.C. § 119 of Dutch Patent Application No. 2015092, filed on Jul. 6, 2015, the contents of each of which are hereby incorporated in their entireties by reference.

BACKGROUND

Some embodiments are directed to a displacement device. Particular non-limiting embodiments provide displacement devices for use in the semiconductor fabrication industry.

Many industrial applications may require positioning an object accurately along at least two directions which are generally orthogonal to one another. Take semi-conductor industry for example, fabrication of integrated circuits may require accurate positioning an object (e.g. a wafer or a reticle) in at least two directions for the purposes of photolithography, inspection, cutting, packaging, etc. Conventional technology stacks stages, wherein each stage may only cause a single degree-of-freedom movement, to produce combined multiple degree-of-freedom movements. For example, the well-known 'H-bridge' design, which includes an X-stage and a Y-stage, wherein, the X-stage is used to cause movement of the Y-stage along the X-direction and the Y-stage is used to carry an object and cause movements along the Y-direction. Combined effort of the X-stage and the Y-stage is able to position the object on the whole X-Y plane.

Recently, displacement devices were introduced that directly cause movement of the stage on at least two orthogonal directions, e.g. the X and Y directions. Such a device is generally referred to as 'planar motor'. For some planar motors, the stage may be controlled to move in six degrees-of-freedom. A planar motor has two parts: a stator and a stage. The stator generally has larger dimension in the X-direction and the Y-direction than the stage for the purpose of providing a working region. One of the two parts includes a system of magnets and another part includes a system of electric coils. The interactions between current-carrying coils and magnets may cause movements of the stage relative to the stator. As these interactions are of electromagnetic nature, the two parts do not need any mechanical contact which eliminates disturbance forces, such as friction. As a result, higher positioning accuracy than conventional technologies may be achieved. Positioning accuracy is the key performance criteria of a displacement device. Higher positioning accuracy indicates less error between the true position of the object being positioned and the reference position. Due to the compact design, the mass of the stage is much less than that of conventional technologies. As such, the same acceleration with less force may be achieved. Compared with conventional technologies, other advantages of the 'planar motor' technology are easier assembling, less maintenance, suitability to use in vacuum or high-cleanness environments.

U.S. Pat. No. 6,496,093 describes a moving-coil planar motor, wherein, magnets are fixed to the stator and coils are fixed to the stage. The magnets are arranged in a pattern of rows and columns, which have 45 degrees angle difference from the orientation of the coils. This 45 degrees angle makes it difficult to assemble the magnets on the stator and to align the coils relative to the magnets. Error in alignment of coils relative to magnets compromises positioning accuracy. Furthermore, the manufacturing cost is high because a large number of magnets may be required.

International publication WO 2009/083889 describes a moving-magnet planar motor, wherein, magnets are fixed to the stage and coils are fixed to the stator. The magnets are grouped in to two kinds of magnet blocks: the first kind including magnets elongated in the X-direction and the second kind including magnets elongated in the Y-direction. The magnet blocks of the two kinds are arranged in a pattern of rows and columns with the rows parallel to the X-direction and the columns parallel to the Y-direction. The coils are formed by coil traces of two kinds: the coil traces of the first kind extend continuously over the whole stator in the X-direction and the coil traces of the second kind extend continuously over the whole stator in the Y-direction. The coil traces are arranged in multiple layers with each layer formed by coil traces of a single kind (either the first kind or the second kind).

The X-dimension and Y-dimension of the stator must or should be large enough to achieve the displacement range of the stage. If the coils are fixed to the stator, as described in international publication WO 2009/083889, the stator must or should include a large number of coils and all of them must or should be powered. This introduces a problem: either a large number of power amplifiers may be required, which indicates high cost, or the coils in the stator must or should be switched on and off according to the position of the stage (in order to reduce the number of power amplifiers), which indicates high complexity and low reliability. It is also mentioned in the international publication WO 2009/083889 that alternatively the coils may be fixed to the stage and the magnets may be fixed to the stator. However, this would end up with a planar motor with many problems. First, applying multi-phase commutation, Lorentz forces exerted on the coil traces vary with stage positions relative to the stator (position-dependent). Variation of the Lorentz forces has equivalent effect of disturbance forces, which would lower the positioning accuracy. Second, these position-dependent Lorentz forces are not able to produce a torque in a certain direction at some stage positions relative to the stator regardless of the amount of current supplied to the coils. At these positions, the rotational movement in the particular direction of the stage is uncontrollable and therefore, additional bearings (e.g. mechanical bearings, air bearings, etc.) may be required to limit the rotational movements of the stage. These bearings are undesired because they would introduce disturbances which further lower the positioning accuracy.

SUMMARY

Some embodiments are directed to a displacement device in which at least one of the problems of the related art is solved.

Therefore, according to a first aspect there is provided a displacement device including a stage and a stator, wherein the stator is arranged to provide a working region and the stator includes a system of magnet blocks.

The system of magnet blocks includes:

a plurality of magnet blocks of a first kind, each magnet block of the first kind including a plurality of first magnets generally linearly elongated in a first direction, each of the first magnets having a magnetization direction generally orthogonal to the first direction and at least two of the first magnets having magnetization directions that are different from one another; and a plurality of magnet blocks of a second kind, each magnet block of the second kind including a plurality of second magnets generally linearly elongated in a second direction generally orthogonal to the first direction, each of the second magnets having a magnetization direction generally orthogonal to the second direction and at least two of the second magnets having magnetization directions that are different from one another.

The stator generally has a larger dimension in the first direction and the second direction than the stage for the purpose of providing the working region.

The stage is movably arranged next to the stator in a third direction generally orthogonal to both the first direction and the second direction and the stage includes a system of electric coils, the system of electric coils including a coil block of a first kind, each coil block of the first kind including a plurality of electric conductors generally linearly elongated in the first direction.

The system of electric coils further includes a coil block of a second kind, each coil block of the second kind including a plurality of electric conductors generally linearly elongated in the second direction.

A dimension in the first direction of a coil block of the first kind is substantially equal to $n(m_1+m_2)$, where $n=1,2,3,\ldots$ and $m_1$ is a dimension in the first direction of a certain magnet block of the first kind and $m_2$ is a dimension in the first direction of a magnet block of the second kind next to the certain magnet block of the first kind, and a dimension in the first direction of a coil block of the second kind is substantially equal to $n(m_1+m_2)$, where $n=1,2,3,\ldots$ and $m_1$ is a dimension in the first direction of a certain magnet block of the first kind and $m_2$ is a dimension in the first direction of a magnet block of the second kind next to the certain magnet block of the first kind.

The displacement device further includes one or more power amplifiers arranged to supply current in the coil block of the first and second kind and to thereby effect relative movement between the stator and the stage in at least two directions.

The displacement device as described in this invention is a moving-coil planar motor has the following advantages. Comparing with U.S. Pat. No. 6,496,093, the number of magnets that may be required is less and the assembling of the magnets is easier, which leads to lower cost. Furthermore, the alignment of stage with respect to the stator is easier because the orientations of the coil blocks are either perpendicular or parallel to that of the magnets.

Comparing with the international publication WO 2009/083889, a moving-coil planar motor which is described in this invention may require less power amplifiers with lower complexity and higher reliability. Furthermore, the dimensions of each coil block have a particular relation with the dimensions of the magnet blocks such that, with proper multi-phase commutation, Lorentz forces exerted on each of the coil blocks may be constant or substantially constant regardless of the stage position relative to the stator (position-independent). Without the variation of the Lorentz forces, higher positioning accuracy may be achieved. Each coil block of the first kind may be used to produce independently-controlled forces in the Y-direction and the Z-direction. Each coil block of the second kind may be used to produce independently-controlled forces in the X-direction and the Z-direction. Combining efforts of all coil blocks, the stage may be controlled to make translational movements in the three directions (X, Y, and Z). However, additional bearings (e.g. mechanical ball bearings, air bearings, etc.) may still be required to limit the rotational movements of the stage as torques which may be necessary to make rotational movements of the stage, cannot be independently controlled.

In an embodiment, the system of electric coils includes one or more additional coil blocks of the first kind, wherein mass center points of at least two coil blocks of the first kind are arranged at different positions in the first direction and mass center points of at least three coil blocks are not linearly aligned. With proper multi-phase commutation, each of the two coil blocks of the first kind may produce independently-controlled forces in the Y-direction and the Z-direction. Two independently-controlled forces with an arm result in an independently-controlled torque. Combining the effort of all coil blocks, the stage may be controlled to make translational movements in three directions (X, Y, Z) and rotational movements in three directions (X, Y, Z), which are referred to as the six degrees-of-freedom movements. Therefore, the stage may be stabilized and supported by only magnetic fields and no additional bearing is needed. As a result, higher positioning accuracy may be achieved.

In an embodiment, the system of magnet blocks includes a 1-dimensional array containing a row with a plurality of columns, the row containing alternately a column formed by a magnet block of the first kind and a column formed by a magnet block of the second kind, the row being generally parallel to the first direction and each of the columns being generally parallel to the second direction. An advantage of this embodiment is that the number of magnets that may be required by the stator is further reduced and subsequently manufacturing cost of the stator is further reduced.

Other possible or preferred embodiments and their advantages will become clear to the reader when reading the description and the drawings.

BRIEF DESCRIPTION OF THE DRAWINGS

These and other aspects of some embodiments are apparent from and will be elucidated with reference to the embodiments described hereinafter. In the drawings, FIG. 1A is a diagrammatic X-Y plane view of a displacement device according to a particular embodiment;

FIG. 1B is a diagrammatic X-Z plane view of the FIG. 1A displacement device;

Figure 1C:
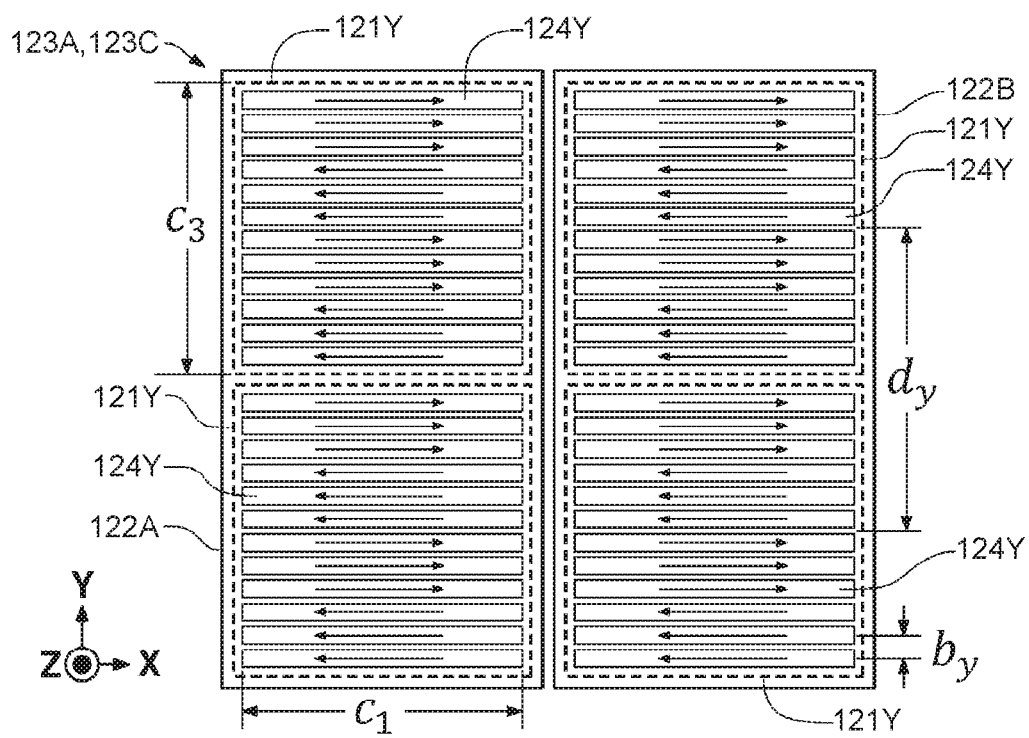
FIG. 1C shows additional detail of a layer of coil blocks of the FIG. 1A displacement device in accordance with a particular embodiment.

It should be noted that items which have the same reference numbers in different figures, have the same structural features and the same functions, or are the same signals. Where the function and/or structure of such an item has been explained, there is no necessity for repeated explanation thereof in the detailed description.

DETAILED DESCRIPTION OF EXEMPLARY EMBODIMENTS

Throughout the following description specific details are set forth in order to provide a more thorough understanding to persons of ordinary skill in the art. However, well known elements may not have been shown or described in detail to avoid unnecessarily obscuring the disclosure. Accordingly, the description and drawings are to be regarded in an illustrative, rather than a restrictive, sense.

Displacement devices are provided which include a stator and a stage. The stage includes a plurality of coils blocks arranged to provide pluralities of electric conductors in one or a plurality of layers. Layers of coil blocks may be situated next to one another in the Z-direction, also referred to as third direction. The stator includes a plurality of magnet blocks. Each magnet block may include a plurality of magnets situated next to one another in a corresponding direction and at least two of the magnets have different magnetization directions. The magnets are placed in a so-called Halbach arrangement here. Such an arrangement leads to an intensification of the magnetic field, so that the forces in the direction of movement are greater. One or more amplifiers may be selectively connected to drive current in the coil blocks and to thereby effect relative movement between the stator and the stage.

Particular Embodiment

FIG. 1A is a diagrammatic X-Y plane view of a displacement device 100 according to a particular embodiment. FIG. 1B is a diagrammatic X-Z plane view of displacement device 100. Displacement device 100 includes a stator 110 and a stage 120 which are movable relative to one another. Stator 110 includes a system 111 of magnet blocks 112X, 112Y (collectively, magnet blocks 112). System 111 includes a 2-dimensional array of magnet blocks 112 having a plurality of rows and columns which are mutually perpendicular. The rows are parallel to the X-direction, also referred to as first direction, and the columns are parallel to the Y-direction, also referred to as second direction. Each row and each column contains alternately magnet blocks 112X and magnet blocks 112Y.

In the illustrated FIG. 1A embodiment, all rows have substantially equal X-dimension and all columns have substantially equal Y-dimension. This is possible or preferred because manufacturing cost of stator 110 may be reduced but it is not necessary. In some embodiments, the X-dimension of a first column (as indicated by $m_1$ in FIG. 1A) may be different from that of a second column (as indicated by $m_2$ in FIG. 1A), which is arranged next to the first column. In some embodiments, the Y-dimension of a first row (as indicated by $m_3$ in FIG. 1A) may be different from that of a second row (as indicated by $m_4$ in FIG. 1A), which is arranged next to the first row. All magnet blocks 112 in a single column have substantially equal X-dimension and all magnet blocks 112 in a single row have substantially equal Y-dimension. Therefore, $m_1$ may be the X-dimension of a plurality of magnet blocks 112Y and $m_2$ may be the X-dimension of a plurality of magnet blocks 112X and $m_3$ may be the Y-dimension of a plurality of magnet blocks 112Y and $m_4$ may be the Y-dimension of a plurality of magnet blocks 112X.

Each magnet block 112X includes a plurality (e.g. four in the illustrated embodiment) of magnets 113X, which are situated next to one another in the X-direction and are generally elongated in the Y-direction. Each magnet block 112Y includes a plurality (e.g. four in the illustrated embodiment) of magnets 113Y, which are situated next to one another in the Y-direction and are generally elongated in the X-direction. Magnetization directions of magnets 113X are generally perpendicular to the Y-direction and magnetization direction of magnets 113Y are generally perpendicular to the X-direction. Magnets 113X, 113Y (collectively, magnets 113) have three kinds: a first kind N, a second kind S, and a third kind H, which are referred to as N-magnets, S-magnets, H-magnets, respectively. Magnets 113 of each magnet block 112 are placed in a so-called Halbach arrangement so that magnetic fields, in which the stage 120 is present, are intensified. The magnetization direction of each N-magnet and S-magnet is parallel to the Z-direction, that of the N-magnets being directed towards stage 120 and that of the S-magnets away from stage 120, as is indicated with arrows in FIG. 1B. The magnetization directions of the H-magnets of magnet blocks 112X are generally parallel to the X-direction, towards the adjacent N-magnet of a magnet block 112X and away from the adjacent S-magnet of a magnet block 112X. The magnetization directions of the H-magnets of magnet blocks 112Y are generally parallel to the Y-direction, towards the adjacent N-magnet of a magnet block 112Y and away from the adjacent S-magnet of a magnet block 112Y.

In the illustrated embodiment (as shown best in FIG. 1A), magnets 113X include four different magnetization directions: +Z, -X, -Z, +X, which together provide a magnetic spatial period $\lambda_x$, and magnets 113Y include four different magnetization directions: +Z, -Y, -Z, +Y, which together provide a magnetic spatial period $\lambda_y$. This is according to the Halbach arrangement and is possible or preferred but it is not necessary. In some embodiments, a magnet block 112 may contain as few as two magnets 113 with different magnetization directions to provide a magnetic spatial period and in some embodiments, a magnet block 112 may contain more than four magnets 113 with different magnetization directions to provide a magnetic spatial period.

In the illustrated embodiment (as shown best in FIG. 1A), magnets 113 belonging to a single magnet block 112 have equal length (the dimension in the direction which magnets 113 are elongated). This is possible or preferred but not necessary. In some embodiments, magnets 113 belonging to a single magnet block 112 may have unequal length. In the illustrated embodiment (as shown best in FIG. 1A), mass center points of magnets 113X belonging to a single magnet block 112X have the same position in the Y-direction and mass center points of magnets 113Y belonging to a single magnet block 112Y have the same position in the X-direction. This is possible or preferred but not necessary. In some embodiments, mass center points of magnets 113X belonging to a single magnet block 112X may have different positions in the Y-direction and mass center points of magnets 113Y belonging to a single magnet block 112Y may have different positions in the X-direction.

In the illustrated embodiment (as shown best in FIG. 1A), magnets 113X of a magnet block 112X have the same or substantially the same X-dimension, and magnets 113Y of a magnet block 112Y have the same or substantially the same Y-dimension. This is possible or preferred but not necessary. In some embodiments, the Z-dimension of magnet blocks 112X may be equal to the X-dimension of magnets 113X, and the Z-dimension of magnet blocks 112Y may be equal to the Y-dimension of magnets 113Y. This is possible or preferred but not necessary. The advantage of these possible or preferred embodiments is that the produced magnetic field is closer to sinusoidal because there are less harmonic distortions. This advantage has been described in many previous publications, e.g. international publication WO 2009/083889. In some embodiments, the H-magnets may have different dimensions from that of the N-magnets and the S-magnets. In some embodiments, there may be no H-magnets. In some embodiments, the Z-dimension of magnet blocks 112 may be other values.

The X-dimension $m_2$ of magnet blocks 112X is equal to or substantially equal to $n\lambda_x/2$, with n=1,2,3, ... (n is chosen as 2 in the illustrated FIG. 1A embodiment), and the Y-dimension $m_3$ of magnet blocks 112Y is equal to or substantially equal to $n\lambda_y/2$, with n=1,2,3, ... (n is chosen as 2 in the illustrated FIG. 1A embodiment). One advantage of this possible or preferred embodiment is that manufacturing cost of system 111 of magnet blocks 112 may be reduced. In some embodiments, $m_2$ may be any values larger than $\lambda_x/2$ and $m_3$ may be any values larger than $\lambda_y/2$.

In the illustrated embodiment (as shown best in FIG. 1A), all magnet blocks 112X have the same arrangement of magnets 113X and all magnet blocks 112Y have the same arrangement of magnets 113Y. This is not necessary. In some embodiments, it may be that only magnet blocks 112X situated at the same column have the same arrangement of magnets 113X and only magnet blocks 112Y situated at the same row have the same arrangement of magnets 113Y. In some embodiments, arrangement of magnets 113 of a magnet block 112 may be different from that of any other magnet blocks 112.

Figure 1D:
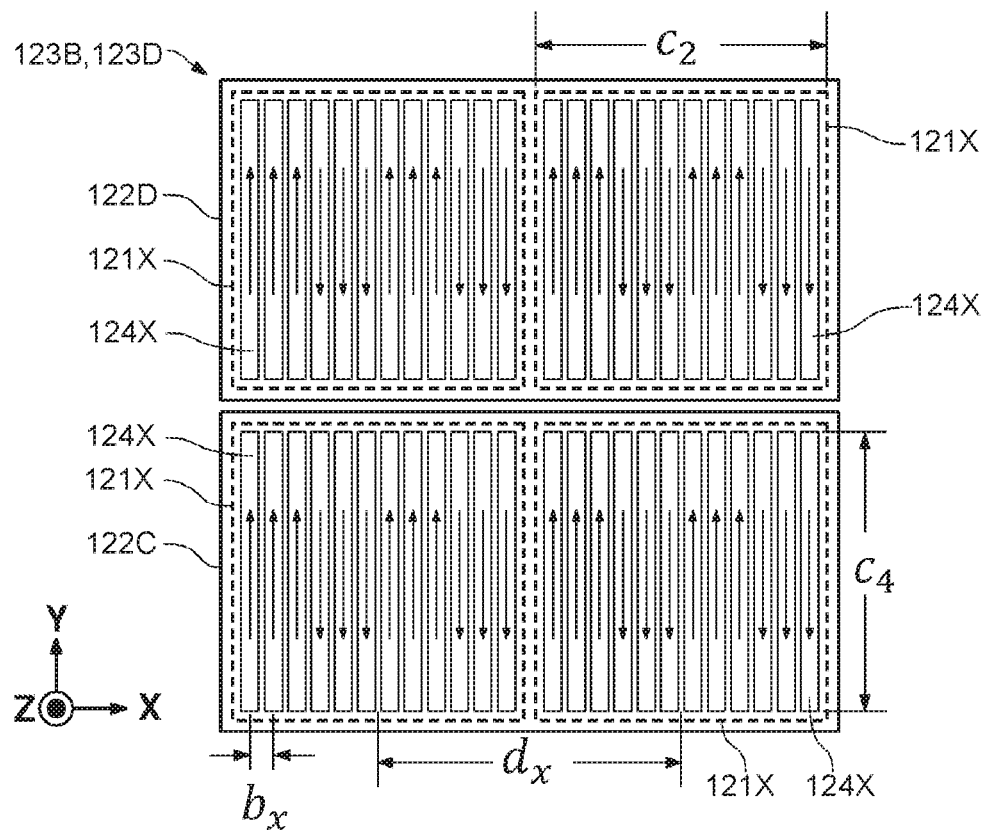
FIG. 1D shows additional detail of another layer of coil blocks of the FIG. 1A displacement device in accordance with a particular embodiment.
Figure 1E:
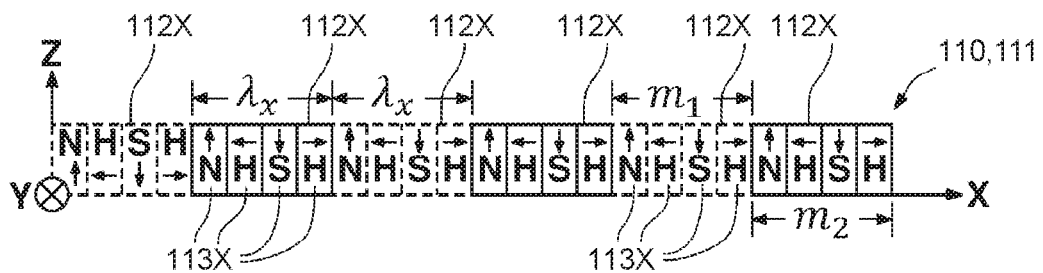
FIG. 1E diagrammatically shows the X-Z plane view of the arrangement of the magnet blocks of the FIG. 1A displacement device in accordance with a particular embodiment.
Figure 1F:
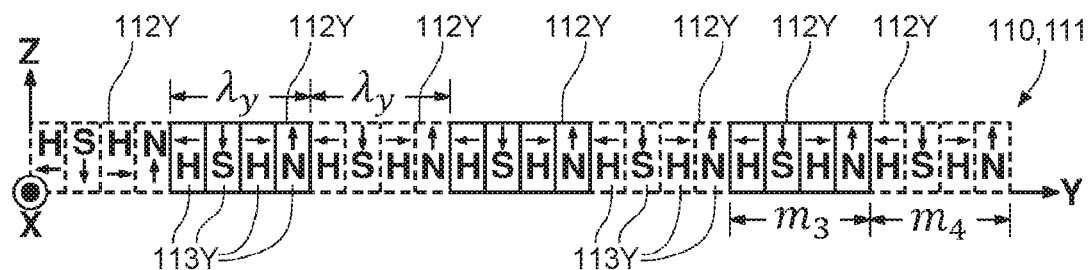
FIG. 1F diagrammatically shows the Y-Z plane view of the arrangement of the magnet blocks of the FIG. 1A displacement device in accordance with a particular embodiment.

FIG. 1E diagrammatically shows the X-Z plane view of the arrangement of system 111 of magnet blocks 112, in which, magnet blocks 112Y are made transparent and only magnet blocks 112X are visible. Magnet blocks 112X which are marked by dashed outlines are situated at different rows (different positions in the Y-direction) from magnet blocks 112X which are marked with solid outlines. By making magnet blocks 112Y transparent, the spatial period $\lambda_x$ of magnet blocks 112X and its relation with the X-dimension ($m_1$ and $m_2$) of magnet blocks 112X are more clearly shown. FIG. 1F diagrammatically shows the Y-Z plane view of the arrangement of system 111 of magnet blocks 112, in which, magnet blocks 112X are made transparent and only magnet blocks 112Y are visible. Magnet blocks 112Y which are marked by dashed outlines are situated at different columns (different positions in the X-direction) from magnet blocks 112Y which have solid outlines. By making magnet blocks 112X transparent, the spatial period $\lambda_y$ of magnet blocks 112Y and its relation with the Y-dimension ($m_3$ and $m_4$) of magnet blocks 112Y are more clearly shown. Note that $m_1=m_2$ and $m_3=m_4$ for the illustrated embodiment. One of the many important observations made by comparing FIG. 1E and FIG. 1F is that, the characteristics of magnet block 112X may be similar to those of magnet block 112Y, except that the X and Y directions are swapped. For example, the pattern of magnetization directions of magnets 113 of both magnet blocks 112X and 112Y are: N, H, S, H, N, H, S, H, . . . . This is possible or preferred but not necessary. In some embodiments, magnet blocks 112X may have different characteristics from magnet blocks 112Y.

In the illustrated embodiment (as shown best in FIG. 1B), stage 120 includes a system of electric coils with a plurality (e.g. four in the illustrated embodiment) of layers 123A, 123B, 123C, 123D (collectively, layers 123) with coil block units 122A, 122B, 122C, 122D (collectively, coil block units 122). The layers 123 are situated next to one another in the Z-direction. The details of layers 123 and coil block units 122 are further illustrated in FIG. 1C and FIG. 1D which will be explained in more details below. It will be appreciated that both the number of layers 123 in a stage 120 and the number of coil block units 122 on a layer 123 may be varied for particular implementations and that the number of layers 123 and the number of coil block units 122 on a layer 123 shown in the illustrated embodiment is convenient for the purposes of explanation.

In the illustrated embodiment (as shown best in FIG. 1C), each layer 123A, 123C includes a plurality (e.g. two in the illustrated embodiment) of coil block units 122A, 122B which are situated next to one another in the X-direction. Each coil block unit 122A, 122B includes one or a plurality (e.g. two in the illustrated embodiment) of coil blocks 121Y which are situated next to one another in the Y-direction. Each coil bock 121Y includes a plurality (e.g. twelve in the illustrated embodiment) of electric conductors 124Y which are generally linearly elongated in the X-direction and are situated next to one another in the Y-direction. When present in the magnetic fields of system 111 of magnet blocks 112, Lorentz forces exerted on the coil block units 122A, 122B may cause translational movements of stage 120 in the Y-direction and the Z-direction and rotational movements of stage 120 in three directions (X, Y, Z).

In the illustrated embodiment (as shown best in FIG. 1D), each layer 123B, 123D includes a plurality (e.g. two in the illustrated embodiment) of coil block units 122C, 122D which are situated next to one another in the Y-direction. Each coil block unit 122C, 122D includes one or a plurality (e.g. two in the illustrated embodiment) of coil blocks 121X which are situated next to one another in the X-direction. Each coil bock 121X includes a plurality (e.g. twelve in the illustrated embodiment) of electric conductors 124X which are generally linearly elongated in the Y-direction and are situated next to one another in the X-direction. When present in the magnetic fields of system 111 of magnet blocks 112, Lorentz forces exerted on the coil block units 122C, 122D may cause translational movements of stage 120 in the X-direction and the Z-direction and rotational movements of stage 120 in the three directions (X, Y, Z).

Coil blocks 121X and 121Y are collectively referred to as coil blocks 121. Electric conductors 124X and 124Y are collectively referred to as electric conductors 124. Each coil block 121 is supplied from a p-phase system with p=2,3,4, . . . (p is chosen as 3 for the illustrated embodiment). The length $b_y$ in FIG. 1C, defined as the distance in the Y-direction of the mass center points of two adjacent conductors 124Y in a coil block 121Y, is equal to or substantially equal to $$(n-1)\lambda_y + \frac{\lambda_y}{2p},$$

where n=1,2,3, . . . (n is chosen as 1 for the illustrated embodiment), and the length $b_x$ in FIG. 1D, defined as the distance in the X-direction of the mass center points of two adjacent conductors 124X in a coil block 121X, is equal to or substantially equal to $$(n-1)\lambda_x + \frac{\lambda_x}{2p},$$

where n=1,2,3, . . . (n is chosen as 1 for the illustrated embodiment). The X-dimension of a coil block 121Y is defined as the length of each of the electric conductors 124Y in the coil block 121Y, as indicated by $c_1$ in FIG. 1C. The Y-dimension of a coil block 121Y, as indicated by $c_3$ in FIG. 1C, is defined as $jb_y$, where j is the number of electric conductors 124Y in the coil block 121Y (j is chosen as 12 for the illustrated embodiment). The Y-dimension of a coil block 121X is defined as the length of each of the electric conductors 124X in the coil block 121X, as indicated by $c_4$ in FIG. 1C. The X-dimension of a coil block 121X, as indicated by $c_2$ in FIG. 1C, is defined as $jb_x$, where j is the number of electric conductors 124X in the coil block 121X (j is chosen as 12 for the illustrated embodiment).

In the illustrated embodiment (as shown best in FIG. 1C and FIG. 1D), all coil blocks 121 include the same number of electric conductors 124. This is possible or preferred but not necessary. In some embodiments, coil blocks 121 may have different number of electric conductors 124. In the illustrated embodiment, all electric conductors 124 belonging to a single coil block 121 have substantially equal length (the dimension in the direction that the electric conductors 124 are elongated). This is possible or preferred.

The X-dimension of a coil block 121Y is equal to or substantially equal to $n(m_1+m_2)$, with n=1,2,3, . . . (n is chosen as 1 for the illustrated FIG. 1C embodiment). The X-dimension of a coil block 121Y may be equal to or substantially equal to $2nm_1$, with n=1,2,3, . . . if $m_1$ and $m_2$ are equal to or substantially equal to one another. This possible or preferred parameter choice may be the first sufficient condition to obtain position-independent Lorentz force on a coil block 121Y. With proper multi-phase commutation (multi-phase commutation is apparent for a person who is of ordinary skill in the art), Lorentz forces exerted on a coil block 121Y in the Y-direction and the Z-direction may be independently controlled and may be position-independent and the Lorentz force exerted on a coil block 121Y in the X-direction may be zero (position-independent). Position-independent Lorentz forces may lead to higher positioning accuracy.

The Y-dimension of a coil block 121Y is equal to or substantially equal to $n(m_3+m_4)$, with n=1,2,3, . . . (n is chosen as 1 for illustrated FIG. 1C embodiment). The Y-dimension of a coil block 121Y may be equal to or substantially equal to $2nm_3$, with n=1,2,3, . . . if $m_3$ and $m_4$ are equal to or substantially equal to one another. This possible or preferred parameter choice may be the second sufficient condition to obtain position-independent Lorentz force on a coil block 121Y. By satisfying both the first and the second sufficient condition to obtain a position-independent Lorentz force on a coil block 121Y, there is an additional advantage, which is explained as follows. Commutation of a coil block 121Y on the purpose of obtaining position-independent Lorentz forces result in zero or substantially zero torque in the Z-direction. This torque is undesired because it is coupled with the Lorentz forces. Without this torque, higher positioning accuracy may be achieved and complexity of the controller may be lower.

The Y-dimension of a coil block 121X is equal to or substantially equal to $n(m_3+m_4)$, with n=1,2,3, . . . (n is chosen as 1 for illustrated FIG. 1D embodiment). The Y-dimension of a coil block 121Z may be equal to or substantially equal to $2nm_3$, with n=1,2,3, . . . if $m_3$ and $m_4$ are equal to or substantially equal to one another. This possible or preferred parameter choice may be the first sufficient condition to obtain position-independent Lorentz force on a coil block 121X. With proper multi-phase commutation, Lorentz forces exerted on a coil block 121X in the X-direction and the Z-direction may be independently controlled and may be position-independent and the Lorentz force exerted on a coil block 121X in the Y-direction may be zero (position-independent). Position-independent Lorentz forces may lead to higher positioning accuracy.

The X-dimension of a coil block 121X is equal to or substantially equal to $n(m_1+m_2)$, with n=1,2,3, . . . (n is chosen as 1 for the illustrated FIG. 1D embodiment). This possible or preferred parameter choice is the second sufficient condition to obtain position-independent Lorentz force on a coil block 121X. By satisfying both the first and the second sufficient condition to obtain a position-independent Lorentz force on a coil block 121X, there is an additional advantage, which is explained as follows. Commutation of a coil block 121X on the purpose of obtaining position-independent Lorentz forces result in zero or substantially zero torque in the Z-direction. This torque is undesired because it is coupled with the Lorentz forces. Without this torque, higher positioning accuracy may be achieved and complexity of the controller may be lower.

In some embodiments, the sum of the X-dimensions of a plurality of coil blocks 121 of the same kind (121X or 121Y) may be equal to or substantially equal to $n(m_3+m_4)$, with n=1,2,3, . . . . In some embodiments, the sum of the Y-dimensions of a plurality of coil blocks 121 of the same kind (121X or 121Y) may be equal to or substantially equal to $n(m_1+m_2)$, with n=1,2,3, . . . . In some embodiments, coil blocks 121 may have other dimensions.

Current distribution (commutation) in electric conductors 124 of a coil block 121 for the purpose of obtaining a constant Lorentz force parallel to the Z-direction or a constant Lorentz force perpendicular to the Z-direction also leads to local forces that are parallel to the Z-direction which generate an undesired torque perpendicular to the Z-direction. This torque is undesired because it is coupled with the Lorentz forces. In a possible or preferred embodiment (as shown best in FIG. 1C), the distance in the Y-direction between mass center points of two adjacent coil blocks 121Y in the same coil block unit, which is indicated by $d_y$ in FIG. 1C, is equal to or substantially equal to $$\frac{\lambda_y}{2k} + \frac{n\lambda_y}{2},$$

where k is me number of coil blocks 121Y in the coil block unit 122A, 122B (k is chosen as two in the illustrated embodiment) and n=1,2,3, . . . (n is chosen as three in the illustrated embodiment). In a possible or preferred embodiment (as shown best in FIG. 1D), the distance in the X-direction between mass center points of two adjacent coil blocks 121X in the same coil block unit, which is indicated by $d_x$ in FIG. 1D, is equal to or substantially equal to $$\frac{\lambda_x}{2k} + \frac{n\lambda_x}{2},$$

where k is the number of coil blocks 121X in the coil block unit 122C, 122D (k is chosen as two in the illustrated embodiment) and n=1,2,3, . . . (n is chosen as three in the illustrated embodiment). These are possible or preferred parameter choices and the advantage is that the undesired torques generated by the coil blocks 121 which are situated at the same coil block unit 122, eliminate one another so that no or substantially no resulting torque is acting on the coil block unit 122, and therefore, higher positioning accuracy may be achieved and complexity of the controller may be decreased.

One of the many important observations made by comparing FIG. 1C and FIG. 1D is that, the characteristics of a coil block 121X and an electric conductor 124X may be similar to those of a coil block 121Y and an electric conductor 124Y, except that the X and Y directions are swapped. For example, a coil block 121X and a coil block 121Y may have the same number of electric conductors 124 with the same dimension and may be both supplied by a 3-phase system. This may not be necessary. In some embodiments, coil blocks 121X and electric conductors 124X may have different characteristics from coil blocks 121Y and electric conductors 124Y.

Some Embodiments of Coil Blocks

Figure 6A:
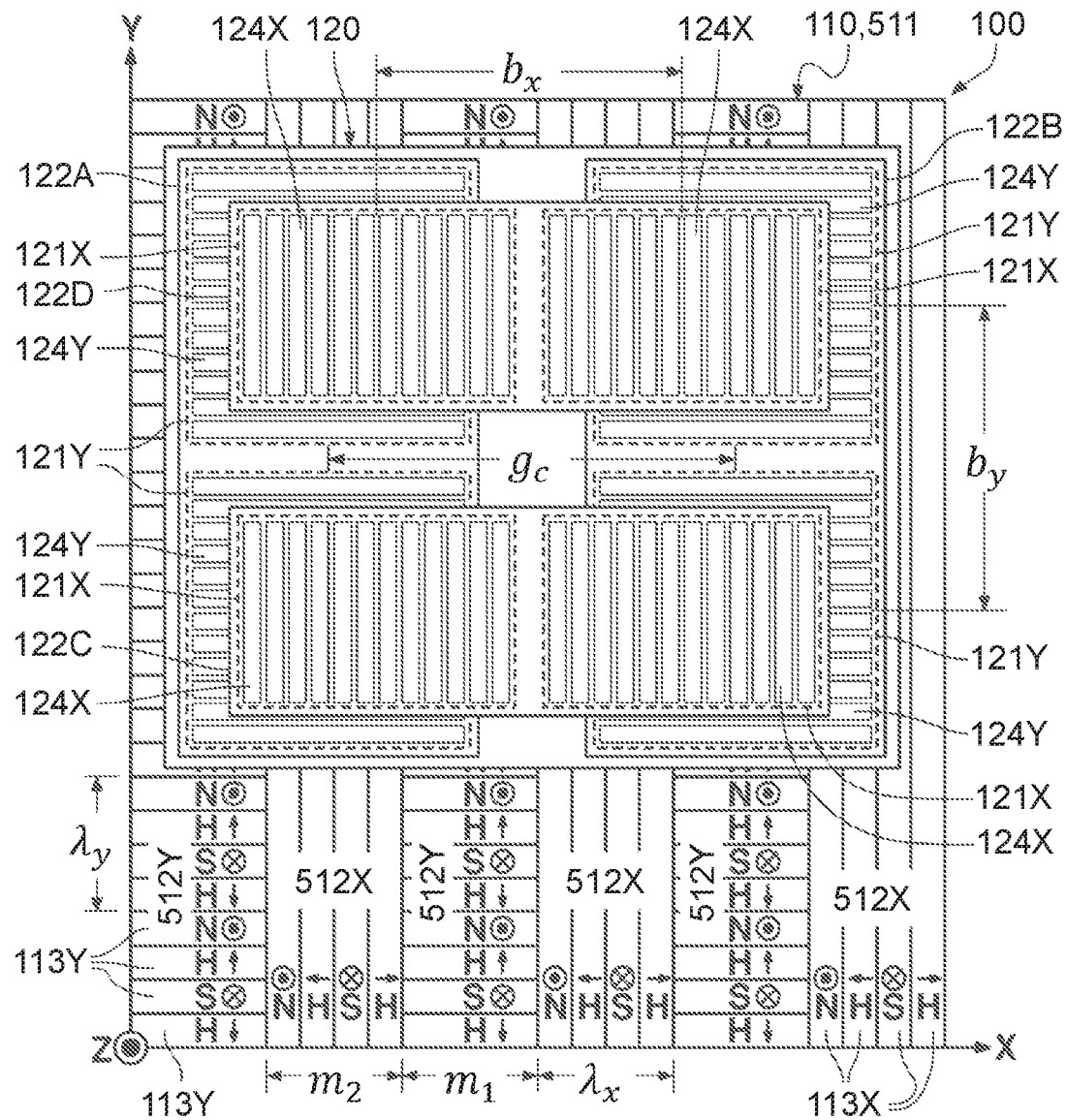
FIG. 6A is a diagrammatic X-Y plane view of a displacement device according to a particular embodiment.

FIG. 2A-FIG. 2D show embodiments of coil blocks 121 suitable for use with the FIG. 1A displacement device 100 and the FIG. 6A displacement device 100. Embodiments of coil blocks 121 are described in FIG. 1C (for coil block 121Y) and FIG. 1D (for coil block 121X). In the description of coil blocks 121 that follows, a comprehensive explanation is provided in the context of an exemplary coil block 121Y. In the embodiments of coil blocks 121Y which will be described below, a coil block 121Y includes a plurality of electric conductors 124Y which are situated next to one another in the Y-direction and are generally linearly elongated in the X-direction, and a coil block 121Y is supplied from a p-phase system (p=3 for FIG. 2A-FIG. 2D embodiments). According to some embodiments, p may be p=2,3,4, . . . . In that case, the number of electric conductors 124Y in a coil block 121Y and the distance in the Y-direction between two adjacent electric conductors 124Y must or should be adjusted accordingly. In the embodiments of coil blocks 121Y which will be described below, an electric conductor 124Y may be formed by one or a plurality of wires and there may be additional conductors (not visible) used to connect any two of the electric conductors 124Y. In the embodiments of coil blocks 121Y which will be described below, the X-dimension of a coil block 121Y is defined as the length of each of the electric conductors 124Y in the coil block 121Y, as indicated by $c_1$ in the corresponding figure. The definition of the Y-dimension of a coil block 121Y varies with the embodiment and will be described below. For brevity, similar embodiments of coil block 112X are not described as coil block 121X and electric conductor 124X may include similar characteristics of coil block 121Y and electric conductor 124Y where the X and Y directions and dimensions are appropriately interchanged.

Figure 2A:
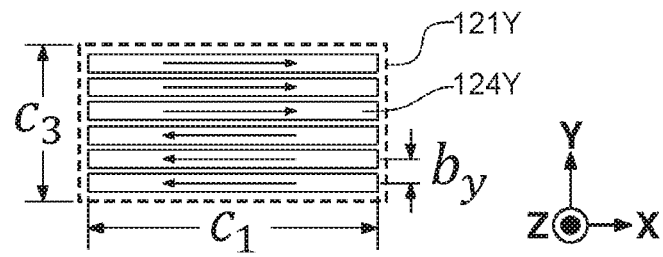
FIG. 2A-2D show additional details of coil blocks suitable for use with the FIG. 1A displacement device in accordance with a particular embodiment.

FIG. 2A diagrammatically shows the X-Y plane view of an embodiment of a coil block 121Y, which includes six electric conductors 124Y. The distance $b_y$ in the Y-direction between the mass center points of two adjacent conductors 124Y in a coil block 121Y, is equal to or substantially equal to $$(n-1)\lambda_y + \frac{\lambda_y}{6},$$

with n=1,2,3, . . . (n=1 in the illustrated embodiment). The Y-dimension of a coil block 121Y, as indicated by $c_3$ in FIG. 2A, is defined as $jb_y$, where j is the number of electric conductors 124Y in the coil block 121Y (j=6 for the illustrated embodiment). The mass center points of the electric conductors 124Y are evenly distributed in the Y-direction and have the same position or substantially the same position in the X-direction.

Figure 2B:
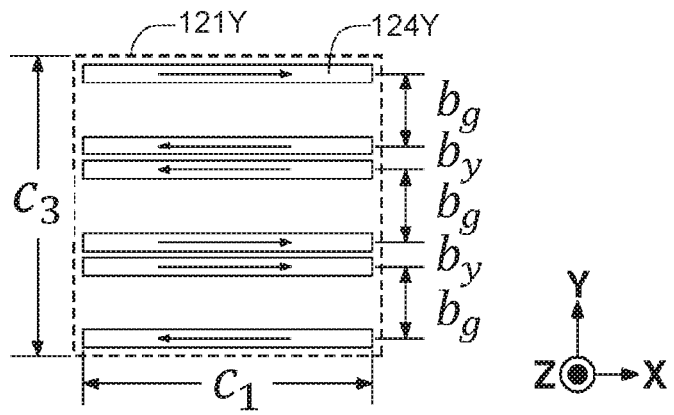

FIG. 2B diagrammatically shows the X-Y plane view of an embodiment of a coil block 121Y, which includes six electric conductors 124Y. The mass center points of the electric conductors 124Y are unevenly distributed in the Y-direction and have the same position or substantially the same position in the X-direction. The distance in the Y-direction between mass center points of the second and the third or the fourth and the fifth electric conductors 124Y, indicated by $b_y$ in FIG. 2B, is equal to or substantially equal to $$\frac{\lambda_y}{6} + (n-1)\lambda_y,$$

with n=1,2,3, . . . (n=1 in the illustrated embodiment). The distance in the Y-direction between mass center points of the first and the second or the third and the fourth or the fifth and the sixth electric conductors 124Y (the length $b_g$ shown in FIG. 2B) is equal to or substantially equal to $$\frac{\lambda_y}{2} + (n-1)\lambda_y,$$

with n=1,2,3, . . . (n=1 in the illustrated embodiment). The Y-dimension of a coil block 121Y, as indicated by $c_3$ in FIG. 2B, is defined as the length $3b_y + 3b_g$.

Figure 2C:
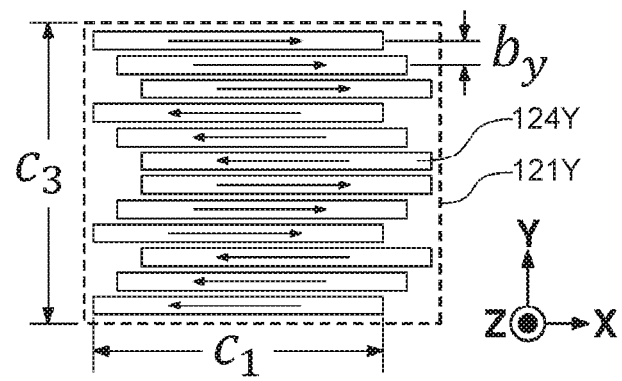

FIG. 2C diagrammatically shows the X-Y plane view of an embodiment of a coil block 121Y, which includes twelve electric conductors 124Y. The mass center points of the electric conductors 124Y are evenly distributed in the Y-direction. The electric conductors 124Y may be divided into three groups. The position in the X-direction of the mass center points of the electric conductors 124Y of the same group are the same or substantially the same and that of different groups are different from one another. The first group includes the first, the fourth, the ninth, the twelfth electric conductors 124Y and the second group includes the second, the fifth, the eighth, the eleventh electric conductors 124Y and the third group includes the third, the sixth, the seventh, the tenth electric conductors 124Y. The distance in the Y-direction between mass center points of two adjacent electric conductors 124Y (the length $b_y$ shown in FIG. 2C) is equal to or substantially equal to $$\frac{\lambda_y}{6} + (n-1)\lambda_y,$$

with n=1,2,3, . . . (n=1 in the illustrated embodiment). The Y-dimension of a coil block 121Y, as indicated by $c_3$ in FIG. 2C, is defined as $jb_y$, where j is the number of electric conductors 124Y in the coil block 121Y (j=12 for the illustrated embodiment).

Figure 2D:
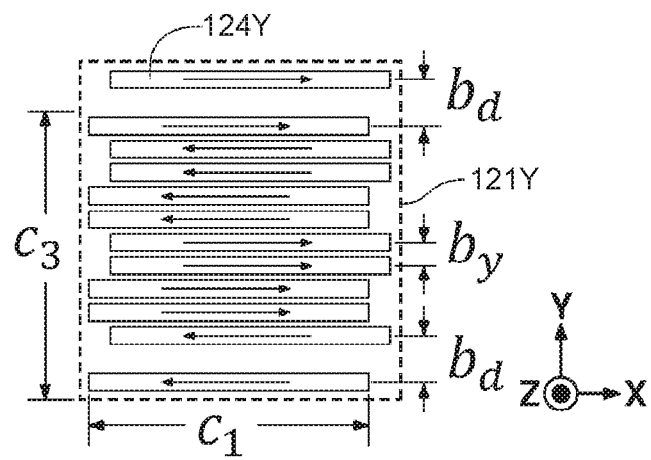

FIG. 2D diagrammatically shows the X-Y plane view of an embodiment of a coil block 121Y, which includes twelve electric conductors 124Y. The mass center points of the electric conductors 124Y are unevenly distributed in the Y-direction. The coil block 121Y according to FIG. 2D embodiment is formed by an arrangement of two coil blocks 121Y according to FIG. 2B embodiment in a particular way, wherein the mass center points of the two coil blocks 121Y according to FIG. 2B embodiment have a distance $b_d$ in the Y-direction being equal to $2b_y$ and a distance in the X-direction being equal to or larger than $b_y$. The Y-dimension of the coil block 121Y according to FIG. 2D embodiment, indicated by $c_3$, is defined as the Y-dimension of the coil block 121Y according to FIG. 2B embodiment.

Some Embodiments of Magnet Blocks

One implementation of system 111 of magnet blocks 112 is described above in connection with FIG. 1A, wherein a diagrammatic X-Y plane view of magnet blocks 112 is provided, and FIG. 1E, wherein magnet blocks 112Y are transparent and only magnet blocks 112X are visible, and FIG. 1F, wherein magnet blocks 112X are transparent and only magnet blocks 112Y are visible. In the description of magnet blocks 112 that follows, a comprehensive explanation is provided in the context of an exemplary system 111 of magnet blocks 112, wherein magnet blocks 112Y are transparent and only magnet blocks 112X are visible. The arrangement of magnets 113 in a magnet block 112 is suitable for use in FIG. 1A displacement device 100 and FIG. 6A displacement device 100. The magnet blocks 112X which are marked with dashed outlines are situated at different rows (different positions viewed from the X-direction) from the magnet blocks 112X which are marked with solid outlines. Each magnet block 112X includes a plurality (e.g. four in the illustrated embodiment) of magnets 113X, which are situated next to one another in the X-direction and are generally elongated in the Y-direction. The magnetization directions of magnets 113X are generally perpendicular to the Y-direction. The corresponding system 111 of magnet blocks 112, wherein magnet blocks 112X are transparent and only magnet blocks 112Y are visible is not described as magnet blocks 112Y and magnets 113Y may include similar characteristics of magnet blocks 112X and magnet 113X where the X and Y directions and dimensions are appropriately interchanged.

Figure 3A:
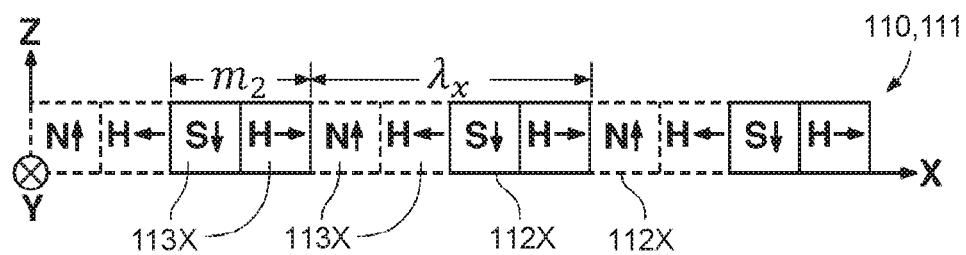
FIG. 3A-3E show additional details of magnet blocks suitable for use with the FIG. 1A displacement device in accordance with a particular embodiment.

FIG. 3A diagrammatically shows the X-Z plane view of an embodiment of system 111 of magnet blocks 112. The magnetization directions of magnets 113X include a pattern of +Z, −X, −Z, +X, which is repeated and provides a magnetic spatial period $\lambda_x$. The X-dimension $m_2$ of magnet blocks 112X in the FIG. 3A embodiment is equal to or substantially equal to $$\frac{\lambda_x}{2}.$$

One of the many important observations is that the arrangement of magnets 113X of a column of magnet blocks 112X is different from that of the adjacent column of magnet blocks 112X.

Figure 3B:
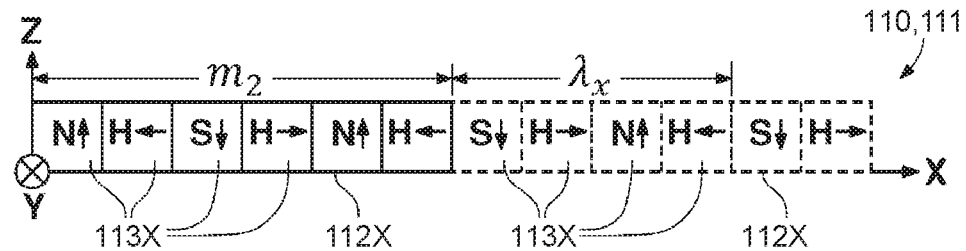

FIG. 3B diagrammatically shows the X-Z plane view of an embodiment of system 111 of magnet blocks 112. The magnetization directions of magnets 113X include a pattern of +Z, −X, −Z, +X, which is repeated and provides a magnetic spatial period $\lambda_x$. The X-dimension $m_2$ of magnet blocks 112X in the FIG. 3B embodiment is equal to or substantially equal to $$\frac{3\lambda_x}{2}.$$

The arrangement of magnets 113X of a column of magnet blocks 112X is different from that of the adjacent column of magnet blocks 112X.

Figure 3C:
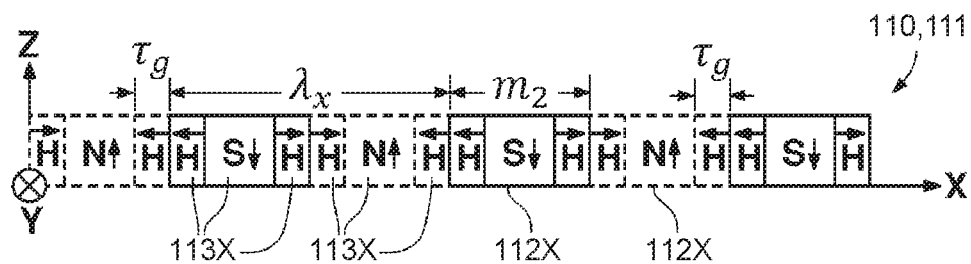

FIG. 3C diagrammatically shows the X-Z plane view of an embodiment of system 111 of magnet blocks 112. The magnetization directions of magnets 113X include a pattern of +Z, −X, −X, −Z, +X, +X, which is repeated and provides a magnetic spatial period $\lambda_x$. The X-dimension $m_2$ of magnet blocks 112X in the FIG. 3C embodiment is substantially equal to $$\frac{\lambda_x}{2}.$$

The sum X-dimension of two adjacent H-magnets is equal to or substantially equal to the X-dimension of the N-magnets and the S-magnets. This is possible or preferred but not necessary. In some embodiments, the sum X-dimension of two adjacent H-magnets may be other values. In some embodiments, the X-dimension $T_g$ of the H-magnet may be any value between zero and $\lambda_x$. In some embodiments, the magnetization directions of magnets 113X may include a pattern of +Z, +Z, −X, −Z, −Z, +X.

Figure 3D:
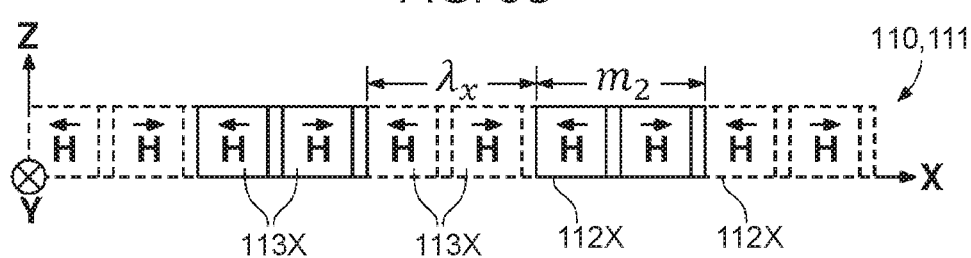

FIG. 3D diagrammatically shows the X-Z plane view of an embodiment of system 111 of magnet blocks 112. The magnetization directions of magnets 113X includes a pattern of +X, −X, which is repeated and provides a magnetic spatial period $\lambda_x$. The X-dimension $m_2$ of magnet blocks 112X in the FIG. 3D embodiment is substantially equal to $\lambda_x$. Magnet blocks 112X are formed by only H-magnets. There is a gap between two H-magnets. This gap does not produce any magnetic fields. This gap may be zero for some embodiments.

Figure 3E:
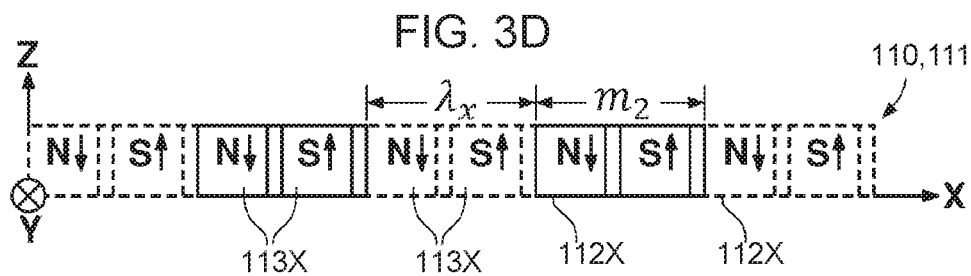

FIG. 3E diagrammatically shows the X-Z plane view of an embodiment of system 111 of magnet blocks 112. The magnetization directions of magnets 113 includes a pattern of +Z, −Z, which is repeated and provides a magnetic spatial period $\lambda_x$. The X-dimension $m_2$ of magnet blocks 112X in the FIG. 3E embodiment is substantially equal to $\lambda_x$. Magnet blocks 112X do not include any H-magnets. There is a gap between an N-magnet and an S-magnet. This gap does not produce any magnetic fields. This gap may be zero for some embodiments.

Some Embodiments of Layers of Coil Block Units

Figure 4A:
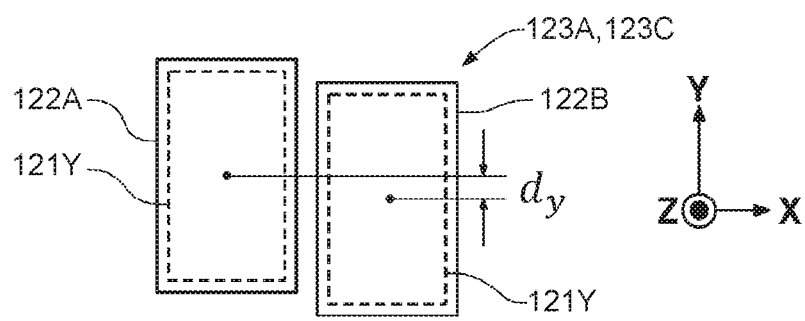
FIG. 4A-4D show additional details of layers of coil blocks suitable for use with the FIG. 1A displacement device in accordance with a particular embodiment.
Figure 4B:
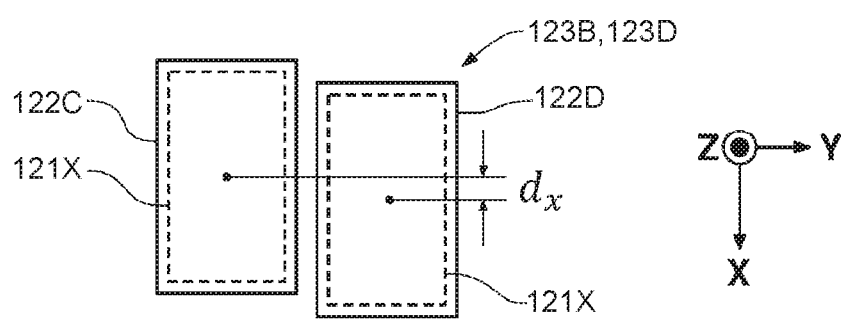
Figure 4C:
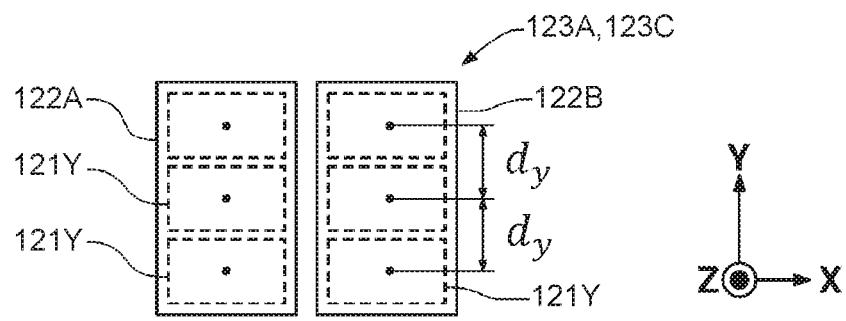
Figure 4D:
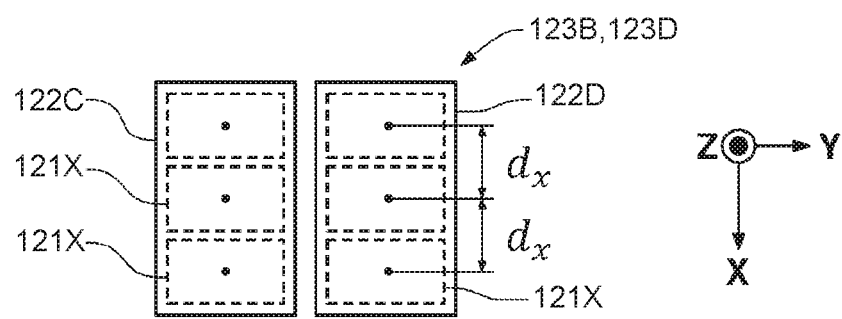

FIG. 4A and FIG. 4C diagrammatically show the X-Y plane view of embodiments of the layers 123A, 123C. FIG. 4B and FIG. 4D diagrammatically show the X-Y plane view of embodiments of the layers 123B, 123D. These embodiments of layers 123 are suitable for use with the FIG. 1A displacement device 100 and FIG. 6A displacement device 100. Each layer 123A, 123C includes a plurality (e.g. two in the illustrated FIG. 4A and FIG. 4C embodiment) of coil block units 122A, 122B, which are situated next to one another in the X-direction. Each layer 123B, 123D includes a plurality (e.g. two in the illustrated FIG. 4B and FIG. 4D embodiment) of coil block units 122C, 122D, which are situated next to one another in the Y-direction. Coil block units 122A, 122B, 122C, 122D are collectively referred to as coil block units 122.

The FIG. 4A embodiment is differed from the FIG. 1C embodiment in two aspects. First, each coil block unit 122 only includes one coil block 121 and each layer 123 only includes two coil blocks 121. Second, the distance between mass center points of the two coil blocks 121Y along the Y-direction (shown as $d_y$ in FIG. 4A) is equal to or substantially equal to $$\frac{\lambda_y}{2k} + \frac{(n-1)\lambda_y}{2},$$

with n=1,2,3, . . . (n=1 for the illustrated FIG. 4A embodiment) and k is the number of coil blocks 121Y in the layer 123 (k=2 for the illustrated FIG. 4A embodiment). The FIG. 4B embodiment is differed from the FIG. 1D embodiment in a similar way. The distance between mass center points of the two coil blocks 121X along the X-direction (shown as $d_x$ in FIG. 4B) is equal to or substantially equal to $$\frac{\lambda_x}{4} + \frac{(n-1)\lambda_x}{2},$$

with n=1,2,3, . . . (n=1 for the illustrated FIG. 4B embodiment) and k is the number of coil blocks 121X in the layer 123 (k=2 for the illustrated FIG. 4B embodiment).

The difference between the FIG. 4C embodiment and the FIG. 1C embodiment is that each coil block unit 122 includes three coil blocks in the FIG. 4C embodiment. This is also the difference between the FIG. 4D embodiment and the FIG. 1D embodiment. The distances $d_x$ and $d_y$ in FIG. 4C and FIG. 4D must or should be adjusted accordingly (k=3 for the FIG. 4C embodiment and the FIG. 4D embodiment).

Some Embodiments of a Stage

Embodiments of stage 120 shown in FIG. 5A-FIG. 5E are suitable for use with the FIG. 1A displacement device 100 and the FIG. 6A displacement device 100. Arrangements of coil blocks in stage 120 shown in FIG. 5A-FIG. 5E may also be used for one or more layers 123. The advantage of stage 120 including multiple layers 123 is that stage 120 may be manufactured using the Printed Circuit Board technology.

Figure 5A:
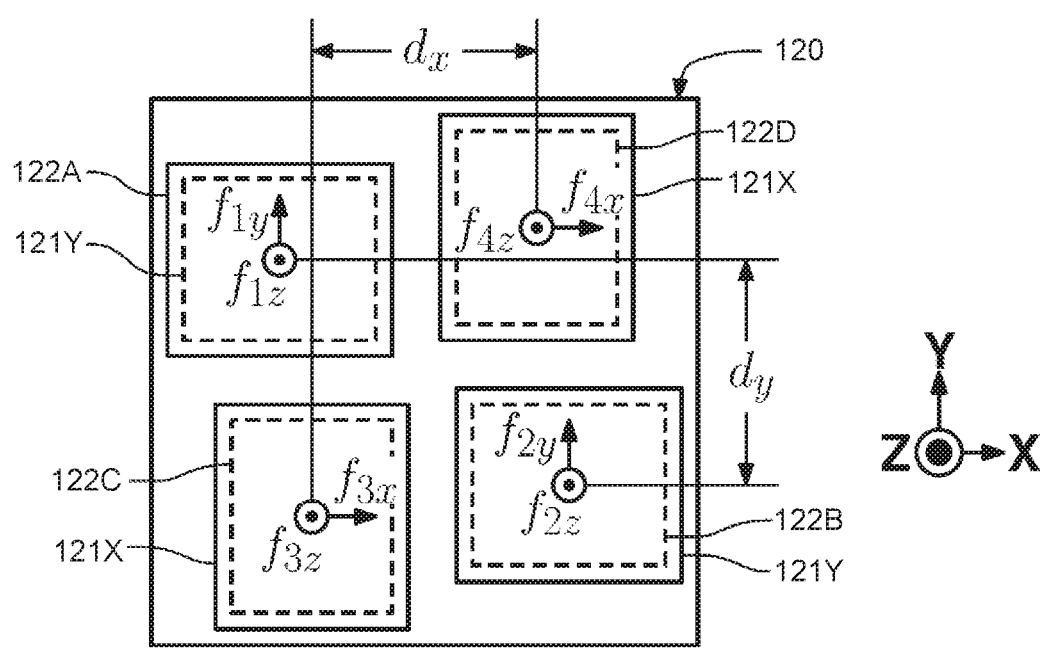
FIG. 5A-5E show additional details of systems of coil blocks suitable for use with the FIG. 1A displacement device in accordance with a particular embodiment.

FIG. 5A diagrammatically shows the X-Y plane view of an embodiment of stage 120, which includes a single layer of a plurality of coil block units 122A, 122B, 122C, 122D (collectively coil block units 122). Coil block units are aligned to have equal or substantially equal position in the Z-direction. Each coil block unit 122A, 122B includes a coil block 121Y, which may provide a constant force in the Y-direction and a constant force in the Z-direction, as indicated by the arrows, when properly supplied by a multi-phase system and are present in the magnetic fields produced by system 111 of magnet blocks 112. Each coil block unit 122C, 122D includes a coil block 121X, which may provide a constant force in the X-direction and a constant force in the Z-direction, as indicated by the arrows, when properly supplied by a multi-phase system and are present in the magnetic fields produced by system 111 of magnet blocks 112. The distance between mass center points of the two coil blocks 121Y in the X-direction is not zero and that in the Y-direction (shown as $d_y$ in FIG. 5A) is equal to or substantially equal to $$\frac{\lambda_y}{4} + \frac{n\lambda_y}{2},$$

with n=1,2,3, . . . , The distance between mass center points of the two coil blocks 121X in the Y-direction is not zero and that in the X-direction (shown as $d_x$ in FIG. 5A) is equal to or substantially equal to $$\frac{\lambda_x}{4} + \frac{n\lambda_x}{2},$$

with n=1,2,3, . . . . The combined effort of Lorentz forces exerted on coil blocks 121 may cause six degrees-of-freedom movements, which are translational motions along three directions (X, Y, Z) and rotational motions around three directions (X, Y, Z).

Figure 5B:
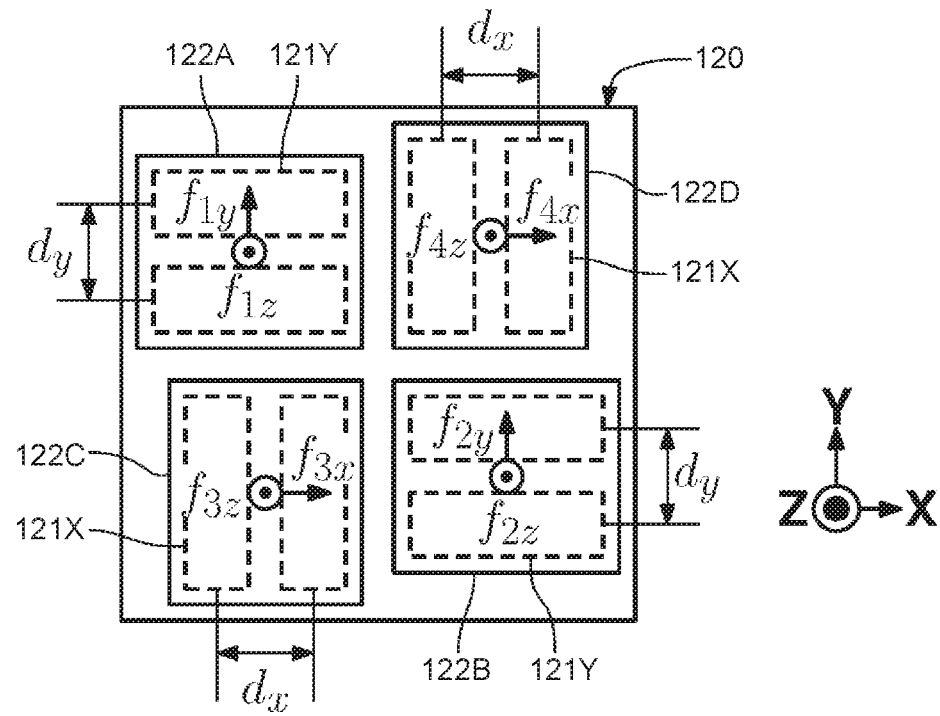

FIG. 5B diagrammatically shows the X-Y plane view of an embodiment of stage 120, which includes a single layer of a plurality of coil block units 122A, 122B, 122C, 122D (collectively coil block units 122). Coil block units 122 are aligned to have equal or substantially equal position in the Z-direction. Each coil block unit 122A, 122B includes two coil blocks 121Y, with the distance between their mass center points in the Y-direction (shown as $d_y$ in FIG. 5B) is equal to or substantially equal to $$\frac{5\lambda_y}{4} + \frac{n\lambda_y}{2},$$

with n=1,2,3, . . . . Each coil block unit 122C, 122D includes two coil blocks 121X, with the distance between their mass center points in the X-direction (shown as $d_x$ in FIG. 5B) is equal to or substantially equal to $$\frac{5\lambda_x}{4} + \frac{n\lambda_x}{2},$$

with n=1,2,3, . . . . Such arrangement eliminates the undesired torques which may result in rocking movements. Current distribution (commutation) in electric conductors 124 may be arranged such that, when present in the magnetic fields produced by system 111 of magnet blocks 112, each coil block unit 122A, 122B provides a constant force in the Y-direction and a constant force in the Z-direction, and each coil block unit 122C, 122D provides a constant force in the X-direction and a constant force in the Z-direction, as indicated by the arrows. The two coil block units, 122A and 122B, have different positions in the X-direction and the two coil block units, 122C and 122D, have different position in the Y-direction. The combined effort of Lorentz forces exerted on coil block units 122 may cause six degrees-of-freedom movements.

Figure 5C:
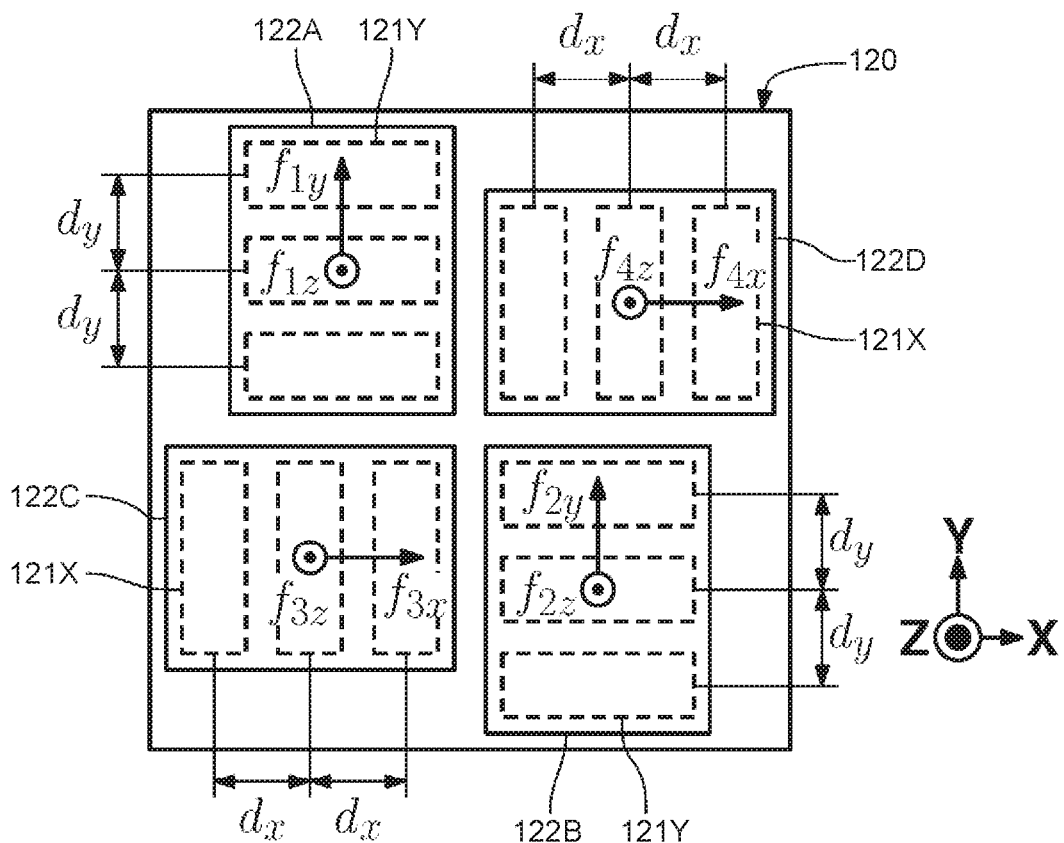

FIG. 5C diagrammatically shows the X-Y plane view of an embodiment of stage 120, which includes a plurality of coil block units 122A, 122B, 122C, 122D (collectively coil block units 122) aligned to have equal or substantially equal position in the Z-direction. The FIG. 5C embodiment is similar to the FIG. 5B embodiment except that each coil block unit 122 includes three coil blocks 121 instead of two, and, accordingly, the distance between mass center points of two adjacent coil blocks 121Y (shown as $d_y$ in FIG. 5C) is equal to or substantially equal to $$\frac{7\lambda_y}{6} + \frac{n\lambda_y}{2},$$

with n=1,2,3, . . . , and the distance between mass center points of two adjacent coil blocks 121X (shown as $d_x$ in FIG. 5C) is equal to or substantially equal to $$\frac{7\lambda_x}{6} + \frac{n\lambda_x}{2},$$

with n=1,2,3, . . . . The combined effort of Lorentz forces exerted on coil block units 122 in the FIG. 5C embodiment may cause six degrees-of-freedom movements.

Figure 5D:
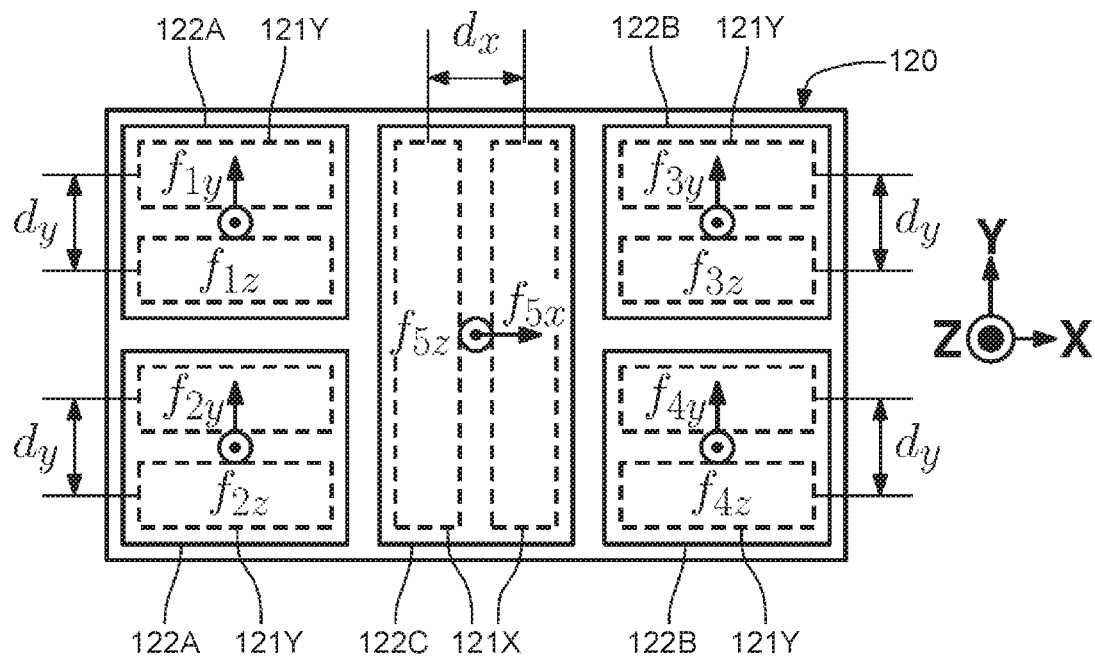

FIG. 5D diagrammatically shows the X-Y plane view of an embodiment of a stage 120, which includes two coil block units 122A, two coil block units 122B, and a coil block unit 122C (collectively coil block units 122) aligned to have equal or substantially equal position in the Z-direction. The four coil block units 122A, 122B are situated at the four corners of the rectangular-shaped stage 320. Each coil block unit 122A, 122B includes a plurality of coil blocks 121Y. The distance between mass center points of two adjacent coil blocks 121Y (shown as $d_y$ in FIG. 5D) is equal to or substantially equal to $$\frac{5\lambda_y}{2k} + \frac{n\lambda_y}{2},$$

where k is me number of coil blocks in the corresponding coil block unit and n=1,2,3, . . . . The coil block unit 122C is situated in the center of the stage 120 and includes a plurality of coil blocks 121X. The distance between mass center points of two adjacent coil blocks 121X (shown as $d_x$ in FIG. 5D) is equal to or substantially equal to $$\frac{5\lambda_x}{2k} + \frac{n\lambda_x}{2},$$

where k is the number of coil blocks in the corresponding coil block unit and n=1,2,3, . . . . The combined effort of Lorentz forces exerted on coil block units 122 may cause six degrees-of-freedom movements.

Figure 5E:
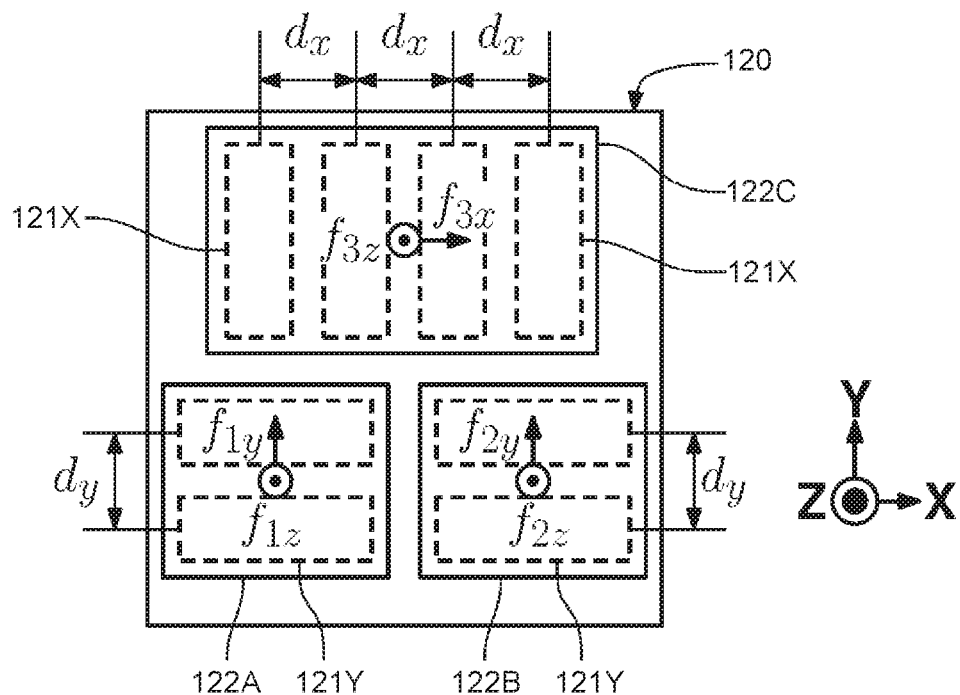

FIG. 5E diagrammatically shows the X-Y plane view of an embodiment of a stage 120, which includes three coil block units 122A, 122B, 122C (collectively coil block units 122) aligned to have equal or substantially equal position in the Z-direction. The mass center points of the three coil block units 122 are not linearly aligned and may form a triangle. Each coil block unit 122A, 122B includes a plurality of coil blocks 121Y. The distance between mass center points of two adjacent coil blocks 121Y (shown as $d_y$ in FIG. 5E) is equal to or substantially equal to $$\frac{5\lambda_y}{2k} + \frac{n\lambda_y}{2},$$

where k is the number of coil blocks in the corresponding coil block unit and n=1,2,3, . . . . The coil block unit 122C includes a plurality of coil blocks 121X. The distance between mass center points of two adjacent coil blocks 121X (shown as $d_x$ in FIG. 5E) is equal to or substantially equal to $$\frac{5\lambda_x}{2k} + \frac{n\lambda_x}{2},$$

where k is the number of coil blocks in the corresponding coil block unit and n=1,2,3, . . . . The combined effort of Lorentz forces exerted on coil block units 122 may cause six degrees-of-freedom movements.

Some Embodiments of a Displacement Device

Figure 6B:
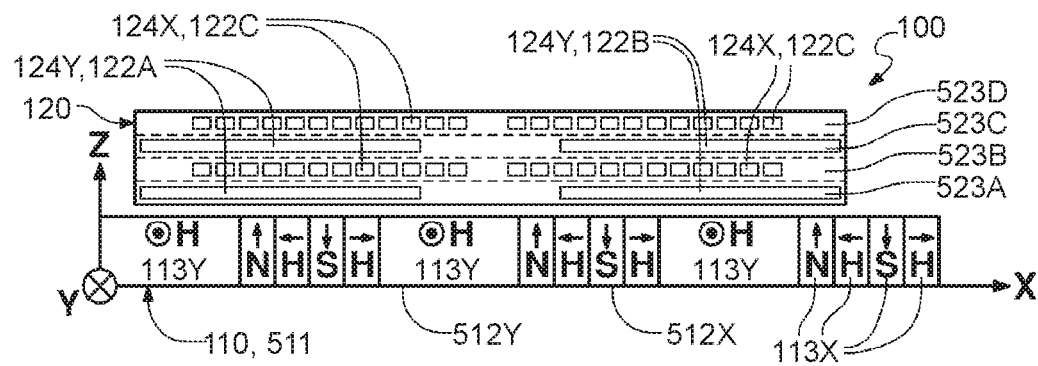
FIG. 6B is a diagrammatic X-Z plane view of the FIG. 6A displacement device.

FIG. 6A is a diagrammatic X-Y plane view of a displacement device 100 according to a particular embodiment. FIG. 6B is a diagrammatic X-Z plane view of the displacement device 100 according to the FIG. 6A embodiment. Displacement device 100 includes a stator 110 and a stage 120 which are movable relative to one another. Stator 110 includes an array 511 of magnet blocks 512X, 512Y (collectively, magnet blocks 512). Array 511 of magnet blocks 512 is a 1-dimensional array, which is formed by one row with a plurality of columns. The row is parallel to the X-direction and the columns are parallel to the Y-direction. The columns of magnet blocks 512X and magnet blocks 512Y are arranged alternately next to one another along the X-direction. As indicated in FIG. 6A, $m_2$ and $m_1$ are the X-dimensions of the magnetic blocks 512X and 512Y, respectively.

In the illustrated embodiment (as shown best in FIG. 6A), each magnet block 512X includes a plurality (e.g. four in the illustrated embodiment) of magnets 113X which are arranged next to one another in the X-direction with magnetization directions generally perpendicular to the Y-direction. Magnets 113X includes a plurality of different magnetization directions which together provide a magnetic spatial period $\lambda_x$. Each magnet block 512Y includes a plurality (e.g. four in the illustrated embodiment) of magnets 113Y which are arranged next to one another in the Y-direction with magnetization directions generally perpendicular to the X-direction. Magnets 113Y includes a plurality of different magnetization directions which together provide a magnetic spatial period $\lambda_x$. The arrangement of magnets 113 of a magnet block 512 is similar to that of a magnet block 112.

In the illustrated embodiment (as best seen in FIG. 6B), stage 120 includes a system of electric coils with a plurality (e.g. four in the illustrated embodiment) of layers 523A, 523B, 523C, 523D (collectively, layers 523) of coil block units 122A, 122B, 122C, 122D (collectively, coil block units 122). It will be appreciated that the number of layers 523 in stage 120 may be varied for particular implementations and that the number of layers 523 shown in the illustrated embodiment is convenient for the purposes of explanation. Each layer 523A, 523C includes a plurality (e.g. two in the illustrated embodiment) of coil block units 122A, 122B, which are situated next to one another in the Y-direction. Each layer 523B, 523D includes a plurality (e.g. two in the illustrated embodiment) of coil block units 122C, 122D, which are situated next to one another in the X-direction.

The possible or preferred embodiment is that $$m_2 = \frac{n\lambda_x}{2},$$

with n=1,2,3, . . . (n=2 in the illustrated FIG. 6A embodiments) and $$m_1 = \frac{n\lambda_x}{2},$$

with n=1,2,3, . . . (n=2 in the illustrated FIG. 6A embodiment). These parameter choices of magnet blocks 512 together is a desired condition to obtain position-independent Lorentz forces on coil blocks 121X. Furthermore, manufacturing cost of array 511 of magnet blocks 512 may be reduced.

The possible or preferred embodiment is that the X-dimension of coil block 121Y, which is also the length of electric conductors 124Y, is equal to or substantially equal to $n(m_1+m_2)$, with n=1,2,3, . . . . The advantage of this parameter choice is that Lorentz forces exerted on each coil block 121Y in the Y-direction and in the Z-direction are position independent and Lorentz forces exerted on each coil block 121Y in the X-direction is zero (position independent). The distance $g_c$ in the X-direction between mass center points of the two coil block units 122A and 122B is equal to or substantially equal to $$(2n-1)\frac{m_1 + m_2}{2},$$

with n=1,2,3, . . . . One of the many important things to mention that $g_c$ may be also the distance in the X-direction between mass center points of two coil blocks 121Y which are situated next to one another in the X-direction. The advantage of this parameter choice is that, undesired torques in the Z-direction produced by two coil blocks 121 eliminate one another. This undesired torque is produced when a coil block 121Y is changing position relative to stator 110 in the X-direction. As such, it is position dependent and it is coupled with the position-independent Lorentz forces.

The distance (shown as $b_y$ in FIG. 6A) in the Y-direction of mass center points of the two coil blocks 121Y of each coil block unit 122A, 122B is equal to or substantially equal to $$\frac{\lambda_y}{2k} + n\lambda_y,$$

where k is the number of coil blocks 121Y in a coil block unit 122A, 122B (e.g. k=2 in the illustrated embodiment) and n=1,2,3, . . . . The corresponding advantage is that the undesired torques in the X-direction, produced by the two coil blocks 121Y of each coil block unit 122A, 122B, eliminate one another.

The possible or preferred embodiment is that the X-dimension of each of the coil blocks 121X is equal to or substantially equal to $n(m_1+m_2)$, with n=1,2,3, . . . and the Y-dimension of each of the coil blocks 121X is equal to or substantially equal to $n\lambda_y$, with n=1,2,3, . . . . The advantage of this parameter choice is that Lorentz forces exerted on each of the coil blocks 121X in the X-direction and the Z-direction may be position independent and Lorentz forces exerted on each coil block 121X in the Y-direction may be zero (position independent).

The distance (shown as $b_x$ in FIG. 6A) in the X-direction of mass center points of the two coil blocks 121X of each coil block unit 122C, 122D is equal to or substantially equal to $$\frac{\lambda_x}{2k} + n\lambda_x,$$

where k is the number of coil blocks 121X in a coil block unit 122C, 122D (e.g. k=2 in the illustrated embodiment) and n=1,2,3, . . . . The corresponding advantage is that the undesired torques in the Y-direction, produced by the two coil blocks 121X of each coil block unit 122C, 122D, eliminate one another.

The combined effort of Lorentz forces exerted on all coil blocks may cause six degrees-of-freedom movements of stage 120.

Control Diagram

Figure 7:
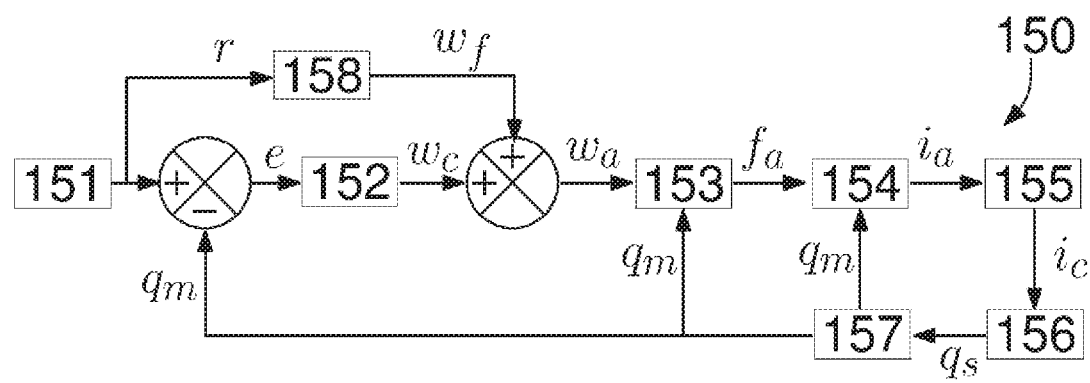
FIG. 7 shows a schematic block diagram of a control system suitable for use in controlling the FIG. 1A and FIG. 6A displacement device.

FIG. 7 shows a schematic block diagram of a control system 150 suitable for use in controlling the displacement device 100. Control system 150 may be implemented by a suitable programmed controller (not expressly shown). Such a controller (and components thereof) may include hardware, software, firmware or any combination thereof. For example, such a controller may be implemented on a programmed computer system including one or more processors, user input apparatus, displays and/or the like. Such a controller may be implemented as an embedded system with a suitable user interface including one or more processors, user input apparatus, displays and/or the like. Processors may include microprocessors, digital signal processors, graphics processors, field programmable gate arrays, and/or the like. Components of the controller may be combined or subdivided, and components of the controller may include sub-components shared with other components of the controller. Components of the controller may be physically remote from one another. The controller is configured to control one or more amplifiers (not expressly shown) to drive current in electric conductors 124 and to thereby controllably move moveable stage 120 relative to stator 110.

In control system 150, the signal r represents the outputs of reference position 151, which is the intended position of the stage 120 relative to a desired reference (not visible). This desired reference is the stator 110 in the illustrated embodiment. In some embodiments, this desired reference may be an independent frame which is different from the stator 110 and the stage 120. The signal $q_m$ represents the outputs of the feedback position coordinate transform 157, which is the measured position of the stage 120 relative to the desired reference. The error signal e is the position error derived by $e=r-q_m$. Each signal, r, $q_m$, e, is generally a vector with the dimension of at least two. A feedback controller 152 takes the error signal e as input and output a signal vector $w_c$, which represents forces and torques used to cause movements of the stage 120. In the illustrated embodiment, a feedforward controller 158 takes the reference position r as input and outputs a signal vector $w_f$, which represents forces and torques used to produce desired movements of stage 120. This is possible or preferred because positioning error may be reduced but it is not necessary. In some embodiments, feedforward controller 158 may be absent. The combined signal vector $w_a$, derived by $w_a=w_f+w_c$, is used to calculate the signal vector $f_a$ by force transformation 153 with and without information contained in $q_m$. The signal vector $f_a$ contains command forces for each coil block. Coil block current commutation 154 takes $f_a$, $q_m$ as input and outputs a signal vector $i_a$, which contains the command current for each electric conductor. Commanded by $i_a$, power amplifiers 155 are used to manipulate the electric currents of each electric conductor which results in movements of stage 120 of displacement device 100. These movements are measured by position sensors 156, wherein, a signal vector $q_s$ is generated and converted to $q_m$ by coordinate transformation 157. Position sensors 156 may include inductive sensors, capacitive sensors, eddy current sensors, hall sensors, laser triangulation sensors, laser interferometers, vision-based sensors, or any combination thereof. Each of power amplifiers 155 may be a multi-phase system, e.g. a 3-phase system.

Multiple Stages

Figure 8:
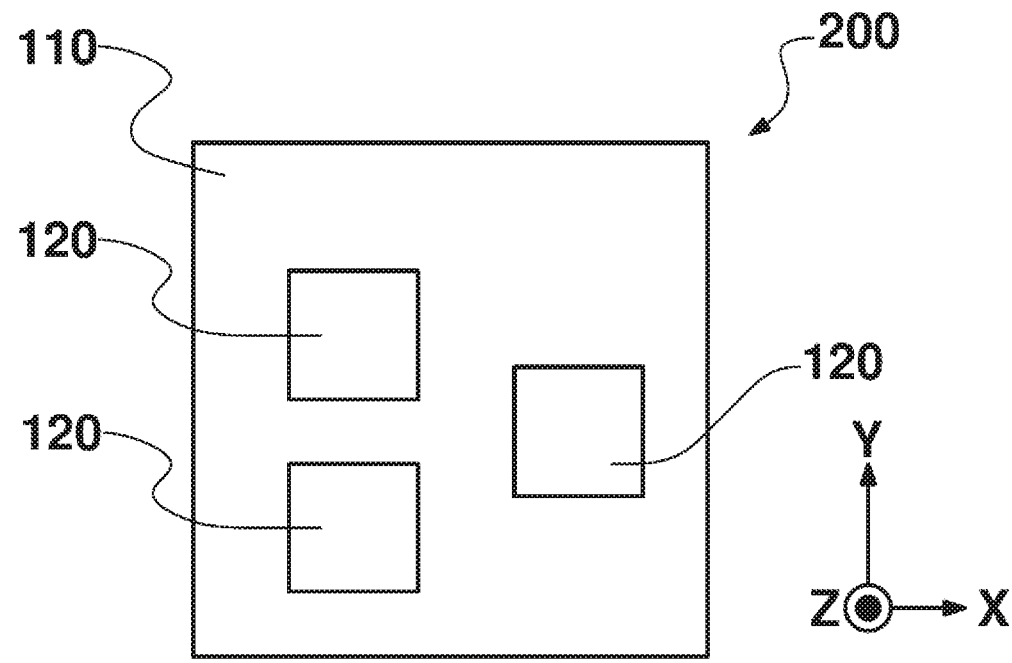
FIG. 8 is a diagrammatic X-Y plane view of a displacement device which has multiple stages according to a particular embodiment.

FIG. 8 diagrammatically shows the X-Y plane view of a displacement device 200, which includes a stator 110 and a plurality (three in the illustrated embodiment) of stages 120. Movements of each stage 120 is measured by position sensors and controlled according to diagram 150.

It should be noted that the above-mentioned embodiments illustrate rather than limit these embodiments, and that those of ordinary skill in the art will be able to design many alternative embodiments.

In the claims, any reference signs placed between parentheses shall not be construed as limiting the claim. Use of the verb "include" and its conjugations does not exclude the presence of elements or steps other than those stated in a claim. The article "a" or "an" preceding an element does not exclude the presence of a plurality of such elements. Some embodiments may be implemented by hardware including several distinct elements, and by a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A displacement device, comprising:
  a stage;
  a stator, arranged to provide a working region, the stator including a system of magnet blocks that include:
    a plurality of first magnet blocks, each first magnet block including a plurality of first magnets generally linearly elongated in a first direction and arranged next to each other in a second direction generally orthogonal to the first direction, each of the first magnets having a magnetization direction generally orthogonal to the first direction and at least two of the first magnets having magnetization directions that are different from one another; and
    a plurality of second magnet blocks, each second magnet block including a plurality of second magnets generally linearly elongated in the second direction and arranged next to each other in the first direction, each of the second magnets having a magnetization direction generally orthogonal to the second direction and at least two of the second magnets having magnetization directions that are different from one another;
  wherein the system of magnet blocks includes a 1-dimensional array containing a row with a plurality of columns, the row containing alternately a column formed by a first magnet block and a column formed by a second magnet block, the row being generally parallel to the first direction and each of the columns being generally parallel to the second direction and wherein at least one of the first magnet blocks has a dimension $m_1$ in the first direction and an adjacent one of the second magnet blocks has a dimension $m_2$ in the first direction;
  wherein the stage is movably arranged next to the stator in a third direction generally orthogonal to both the first direction and the second direction and the stage includes a system of electric coils, including:
    a first coil block including a plurality of electric conductors generally linearly elongated in the first direction and arranged next to each other in the second direction;
    a second coil block including a plurality of electric conductors generally linearly elongated in the second direction and arranged next to each other in the first direction; and
  a dimension in the first direction of the first coil block is substantially equal to $n(m_1+m_2)$, where n=1,2,3, . . . , and a dimension in the first direction of the second coil block is substantially equal to $n(m_1+m_2)$, where n=1, 2,3, . . . ; and
  one or more power amplifiers arranged to supply current in the first coil block and in the second coil block and to thereby effect relative movement between the stator and the stage in at least two directions.

2. The displacement device according to claim 1, wherein the system of electric coils includes one or more additional first coil blocks, wherein mass center points of at least two of the first coil blocks are arranged at different positions in the first direction and mass center points of the second coil block and at least two of the first coil blocks are not linearly aligned.

3. The displacement device according to claim 1, wherein the system of electric coils includes one or more additional second coil blocks, wherein mass center points of at least two of the second coil blocks are arranged at different positions in the second direction and mass center points of the first coil block and at least two of the second coil blocks are not linearly aligned.

4. The displacement device according to claim 1, wherein magnetization directions of first magnets exhibit a magnetic spatial period $\lambda_y$ when viewed from the first direction and magnetization directions of second magnets exhibit a magnetic spatial period $\lambda_x$ when viewed from the second direction.

5. The displacement device according to claim 4, wherein all first magnet blocks have substantially equal dimension in the first direction $m_1$ and $m_1$ is substantially equal to $$\frac{n\lambda_x}{2},$$

with n=1,2,3, . . . , and all second magnet blocks have substantially equal dimension in the first direction $m_2$ and $m_2$ is substantially equal to $$\frac{n\lambda_x}{2},$$

with n=1,2,3, . . . , and a dimension in the second direction of the second coil blocks is substantially equal to $n\lambda_y$, with n=1,2,3, . . . .

6. The displacement device according to claim 1, wherein the system of electric coils includes an additional first coil block, each of the first coil blocks having substantially equal dimension in the first direction and the second direction, and a distance in the first direction between mass center points of the first coil blocks is substantially equal to $$\frac{2n-1}{2}(m_1+m_2),$$

with n=1,2,3, . . . .

7. The displacement device according to claim 1, wherein the system of magnet blocks includes a plurality of 1-dimensional arrays, so as to form a 2-dimensional array having a plurality of rows and columns, each of the rows and columns containing alternately one of the first magnet blocks and one of the second magnet blocks, wherein first magnet blocks in a particular row have an identical arrangement of magnets and wherein second magnet blocks in a particular column have an identical arrangement of magnets.

8. The displacement device according to claim 7, wherein a dimension in the first direction of each of the columns is substantially equal to $$\frac{n\lambda_x}{2},$$

with n=1,2,3, . . . , and a dimension in the second direction of each of the rows is substantially equal to $$\frac{n\lambda_y}{2},$$

with n=1,2,3, . . . .

9. The displacement device according to claim 7, wherein all magnet blocks have substantially equal dimension in the first direction $m_1$ and a dimension in the first direction of each of the coil blocks is substantially equal to $2 nm_1$, where n=1,2,3, . . . , wherein all magnet blocks have substantially equal dimension in the second direction $m_3$ and a dimension in the second direction of each of the coil blocks is substantially equal to $2 nm_3$, where n=1,2,3, . . . .

10. The displacement device according to claim 1, wherein each of the first magnet blocks includes magnets with four magnetization directions being the third direction, the opposite direction of the second direction, the opposite direction of the third direction and the second direction, together providing a magnetic spatial period $\lambda_y$, and wherein each of the second magnet blocks includes magnets with four magnetization directions being the third direction, the opposite direction of the first direction, the opposite direction of the third direction and the first direction, together providing a magnetic spatial period $\lambda_x$.

11. The displacement device according to claim 1, wherein the first coil block and the second coil block are arranged at different layers, the layers being arranged next to one another in the third direction.

12. The displacement device according to claim 4, wherein the system of electric coils includes:
a plurality of first coil blocks,
a plurality of second coil blocks,
wherein a distance in the second direction between mass center points of two of the plurality of first coil blocks is substantially equal to $$\frac{\lambda_y}{2k}+\frac{n\lambda_y}{2},$$

where k is the number of first coil blocks in the stage and n=1,2,3, . . .
and wherein a distance in the first direction between mass center points of two of the plurality of second coil blocks is substantially equal to $$\frac{\lambda_x}{2k}+\frac{n\lambda_x}{2},$$

where k is the number of second coil blocks in the stage and n=1,2,3, . . . .

13. The displacement device according to claim 4, wherein the system of electric coils includes a plurality of first coil blocks grouped into a first coil block unit and a distance in the second direction between mass center points of two of the first coil blocks belonging to the first coil block unit is substantially equal to $$\frac{\lambda_y}{2k}+\frac{n\lambda_y}{2},$$

where k is the number of first coil blocks in the first coil block unit and n=1,2,3, . . . , and wherein the system of electric coils includes a plurality of second coil blocks grouped into a second coil block unit and a distance in the first direction between mass center points of two of the second coil blocks belonging to the second coil block unit is substantially equal to $$\frac{\lambda_x}{2k}+\frac{n\lambda_x}{2},$$

where k is the number of second coil blocks in the second coil block unit and n=1,2,3, . . . .

14. The displacement device according to claim 2, wherein the system of electric coils includes one or more additional second coil blocks, wherein mass center points of at least two second coil blocks are arranged at different positions in the second direction.

15. The displacement device according to claim 2, wherein magnetization directions of first magnets exhibit a magnetic spatial period $\lambda y$ when viewed from the first direction and magnetization directions of second magnets exhibit a magnetic spatial period $\lambda x$ when viewed from the second direction.

16. The displacement device according to claim 3, wherein magnetization directions of first magnets exhibit a magnetic spatial period $\lambda y$ when viewed from the first direction and magnetization directions of second magnets exhibit a magnetic spatial period $\lambda x$ when viewed from the second direction.

* * * * *